(12) United States Patent
Sugawara

(10) Patent No.: US 12,127,313 B2
(45) Date of Patent: Oct. 22, 2024

(54) LIGHT EMITTING DEVICE FOR ASSISTING PHOTOGRAPHING, METHOD OF CONTROLLING SAME, AND STORAGE MEDIUM

(71) Applicant: CANON KABUSHIKI KAISHA, Tokyo (JP)

(72) Inventor: Azusa Sugawara, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 99 days.

(21) Appl. No.: 17/975,125

(22) Filed: Oct. 27, 2022

(65) Prior Publication Data

US 2023/0142109 A1    May 11, 2023

(30) Foreign Application Priority Data

Nov. 5, 2021    (JP) .................. 2021-181023

(51) Int. Cl.
| | |
|---|---|
| *H05B 45/18* | (2020.01) |
| *G01K 3/00* | (2006.01) |
| *G01R 19/00* | (2006.01) |
| *H04N 23/56* | (2023.01) |
| *H04N 23/74* | (2023.01) |

(52) U.S. Cl.
CPC ............ *H05B 45/18* (2020.01); *G01K 3/005* (2013.01); *G01R 19/0084* (2013.01); *H04N 23/56* (2023.01); *H04N 23/74* (2023.01)

(58) Field of Classification Search
CPC ......... H05B 45/18; H04N 23/56; H04N 23/74
USPC ....................................................... 315/308
See application file for complete search history.

(56) References Cited

U.S. PATENT DOCUMENTS

| | | | | |
|---|---|---|---|---|
| 5,923,910 A | * | 7/1999 | Nakahara .................. | G02B 7/32 |
| | | | | 396/123 |
| 6,952,002 B2 | * | 10/2005 | Hashimoto ............ | H04N 23/73 |
| | | | | 348/E5.037 |
| 11,025,806 B2 | * | 6/2021 | Morofuji .................. | H04N 5/30 |
| 2008/0075448 A1 | * | 3/2008 | Awazu ................... | G03B 15/05 |
| | | | | 348/E5.029 |
| 2022/0003870 A1 | * | 1/2022 | Byun ..................... | G01S 7/4913 |
| 2022/0171262 A1 | * | 6/2022 | Ueda ...................... | G03B 21/16 |

(Continued)

FOREIGN PATENT DOCUMENTS

JP    2003-005023 A    1/2003

*Primary Examiner* — Ryan Jager
(74) *Attorney, Agent, or Firm* — Cowan, Liebowitz & Latman, P.C.

(57) ABSTRACT

A light emitting device capable of performing optimum temperature control of an LED in accordance with each of a plurality of photographing assist uses and sufficiently exhibiting performance of each of uses while ensuring reliability of the LED. The light emitting device includes an LED configured to assist photographing of an image capturing apparatus and a temperature sensor. The light emitting device operates at least in one of a first light emission mode in which a light emission time in one lighting operation of the LED is a first time period and a second light emission mode in which the light emission time is a second time period shorter than the first time period. Different light emission controls are performed on the LED between the first light emission mode and the second light emission mode based on temperature information detected by the temperature sensor.

18 Claims, 12 Drawing Sheets

(56) References Cited

U.S. PATENT DOCUMENTS

| | | | |
|---|---|---|---|
| 2023/0142109 A1* | 5/2023 | Sugawara | H05B 45/18 |
| | | | 315/308 |
| 2023/0245547 A1* | 8/2023 | Carr | G01K 1/024 |
| | | | 340/517 |
| 2024/0111248 A1* | 4/2024 | Horiuchi | G03G 21/20 |

* cited by examiner

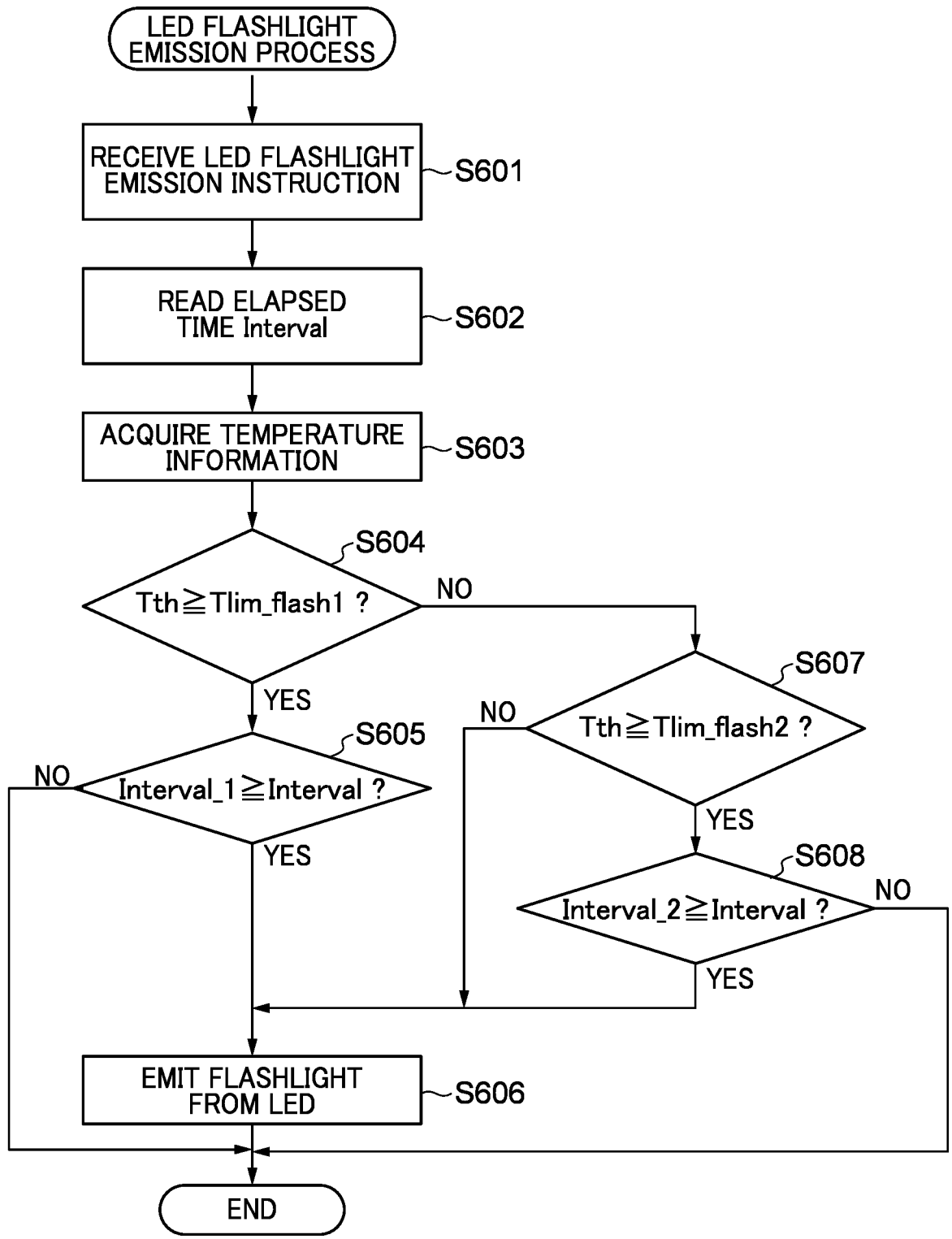

LIGHT EMITTING DEVICE FOR ASSISTING PHOTOGRAPHING, METHOD OF CONTROLLING SAME, AND STORAGE MEDIUM

BACKGROUND OF THE INVENTION

Field of the Invention

The present invention relates to a light emitting device, a method of controlling the same, and a storage medium, and more particularly to a light emitting device used for a plurality of photographing assist uses, a method of controlling the same, and a storage medium.

Description of the Related Art

Conventionally, an AF sensor of a single-lens reflex camera has high compatibility with light of an infrared wavelength region, and infrared light has been used as an AF assist light. However, an AF sensor embedded in an image capturing sensor of a recent mirrorless camera has high compatibility with light of a visible wavelength region, and hence a white or bulb-color LED has been made available as the AF assist light.

The white or bulb-color LED can be used not only as the AF assist light, but also as a LED flashlight, a video light, and a modeling lamp. Further, there are a variety of uses, such as signals for indicating charge completion of a wireless communication strobe, by flickering the LED.

Here, the video light is used in a case where the screen is dark when photographing a moving image, and the modeling lamp is lit before photographing a still image in order to check how an object is irradiated with light emitted from the modeling lamp and how a shade is formed by the light in final photographing, in advance. Therefore, the video light and the modeling lamp are longer in lighting time, compared with the uses, such as the AF assist light and LED flashlight, and are often used for several tens of seconds to several tens of minutes.

On the other hand, in a case where the LED is used as the AF assist light, although time is required to find an in-focus point by driving a focus lens, most of focus lenses can be focused within several seconds.

When the LED is lit, the LED temperature increases, and hence it is necessary to perform heat limitation control, e.g. by dimming or lighting off the LED before the LED temperature reaches a use upper limit temperature, so as to avoid breakage or malfunction of the LED.

The LED package internal temperature cannot be directly measured, and hence this heat limitation control is performed by disposing a thermistor in the vicinity of the LED and predicting the LED package internal temperature from a temperature detected by the thermistor. More specifically, there is a difference and a time lag between the LED package internal temperature and the temperature detected by the thermistor, and hence the LED package internal temperature is required to be predicted with a margin of several degrees centigrade of temperature.

For example, Japanese Laid-Open Patent Publication (Kokai) No. 2003-5023 discloses a technique for acquiring a temperature around an LED used as the AF assist light by using a thermistor and changing the degree of brightness of light emitted from the LED according to a value of the acquired temperature around the LED. This makes it possible to reduce the brightness of light emitted from the LED by reducing electric current caused to flow through the LED when the value of the temperature around the LED is high and thereby suppress the rise of the LED package internal temperature.

However, in the conventional technique disclosed in Japanese Laid-Open Patent Publication (Kokai) No. 2003-5023, there is no description of uses of the LED other than the AF assist light, specifically, uses of the LED for continuously lighting for a relatively long time period, as in the case of a modeling lamp and a video light.

Since the lighting time is short in a case where the LED is used as the AF assist light, the rise of the LED temperature is small and the rise of the temperature around the LED is also small. On the other hand, when the LED is used for lighting continuously for a relatively long time period, as in the case of a modeling lamp and a video light, the rise of the LED temperature by one lighting operation is large, and the rise of the temperature around the LED is also large.

Therefore, it is not preferable to perform the heat limitation control of the LED using the same temperature threshold value between the case where the LED is used as the modeling lamp or the video light and the case where the LED is used as the AF assist light. This is because when the LED is used as the AF assist light, the lighting of the LED may be limited by the heat limitation control even if the LED temperature has not reached an upper limit temperature.

SUMMARY OF THE INVENTION

The present invention provides a light emitting device that is capable of performing optimum temperature control of an LED in accordance with each of a plurality of photographing assist uses and sufficiently exhibiting performance of each use while ensuring reliability of the LED, a method of controlling the same, and a storage medium.

In a first aspect of the present invention, there is provided a light emitting device including a light emission unit, a temperature detection unit, the light emitting device operating at least in one of a first light emission mode in which a light emission time in one lighting operation of the light emission unit is a first time period and a second light emission mode in which the light emission time is a second time period shorter than the first time period, at least one processor; and a memory coupled to the at least one processor, the memory having instructions that, when executed by the processor, perform the operations as a control unit configured to perform different light emission controls on the light emission unit between the first light emission mode and the second light emission mode, based on temperature information detected by the temperature detection unit.

In a second aspect of the present invention, there is provided a method of controlling a light emitting device including a light emission unit and a temperature detection unit, including operating the light emitting device at least in one of a first light emission mode in which a light emission time in one lighting operation of the light emission unit is a first time period and a second light emission mode in which the light emission time is a second time period shorter than the first time period, and performing different light emission controls on the light emission unit between the first light emission mode and the second light emission mode based on temperature information detected by the temperature detection unit.

According to the present invention, it is possible to perform optimum temperature control of the LED in accordance with each of a plurality of photographing assist uses and sufficiently exhibiting performance of each use while ensuring reliability of the LED.

Further features of the present invention will become apparent from the following description of exemplary embodiments (with reference to the attached drawings).

BRIEF DESCRIPTION OF THE DRAWINGS

FIG. 9 is a flowchart of an LED flashlight emission process performed by a strobe controller appearing in FIG. 8.

DESCRIPTION OF THE EMBODIMENTS

The present invention will now be described in detail below with reference to the accompanying drawings showing embodiments thereof.

First, a description will be given of the configuration of a camera system 1 including a light emitting device 300 according to a first embodiment of the present invention, with reference to FIG. 1.

Figure 1:
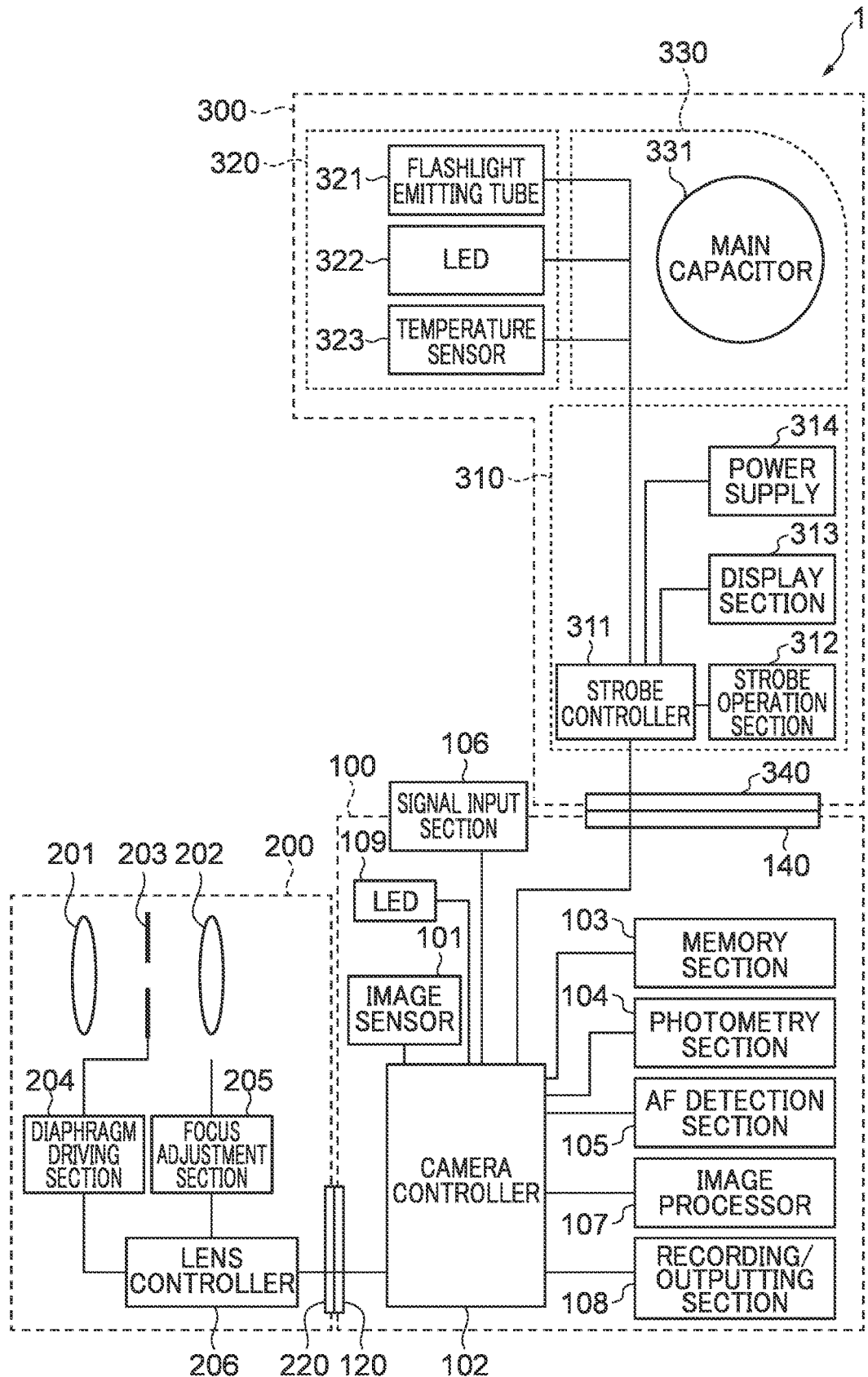
FIG. 1 is a block diagram showing a hardware configuration of a camera system including a light emitting device according to a first embodiment.

FIG. 1 is a block diagram showing a hardware configuration of the camera system 1 including the light emitting device 300 according to the present embodiment.

The camera system 1 includes an image capturing apparatus (camera body) 100, a lens device (interchangeable lens) 200 which can be attached/removed to/from the image capturing apparatus 100, and the light emitting device (external strobe) 300. However, the camera system 1 is not limited to the configuration of the present embodiment insofar as the light emitting device 300 is connected to the image capturing apparatus, and for example, the image capturing apparatus 100 and the lens device 200 may be replaced by an image capturing apparatus including a camera body and a lens integrally provided therein.

The image capturing apparatus 100 includes an image sensor 101, a camera controller 102, a memory section 103, a photometry section 104, an AF detection section 105, a signal input section 106, an image processor 107, a recording/outputting section 108, an LED 109, a camera mount section 120, and a camera-side ACC connection section 140.

The image sensor 101 is implemented e.g. by a CCD or a CMOS sensor, and photoelectrically converts an optical image formed on an imaging surface of the image sensor 101 by an optical system of the lens device 200 to output the resulting analog image signals to the camera controller 102.

The camera controller 102 is a control unit provided in the image capturing apparatus 100, which reads control programs for the respective blocks included in the image capturing apparatus 100 from a ROM of the memory section 103, and loads the programs into a RAM of the memory section 103, for execution. This enables the camera controller 102 to control the operations of the respective blocks included in the image capturing apparatus 100 and perform centralized control of the image capturing apparatus 100 and the lens device 200. To the camera controller 102, there are connected the image sensor 101, the memory section 103, the photometry section 104, the AF detection section 105, the signal input section 106, the image processor 107, the recording/outputting section 108, the LED 109, the camera mount section 120, the camera-side ACC connection section 140, and so forth.

The camera controller 102 has an analog-to-digital converter provided therein, and in a case where analog image signals output from the image sensor 101 are converted from analog to digital by the analog-to-digital converter, the camera controller 102 outputs the digital signals to the RAM provided in the memory section 103 as image data. Further, in a case where the image sensor 101 is caused to function as a photometry sensor, or in a case where pixels forming the image sensor 101 are partially used for phase difference detection, the camera controller 102 directly outputs analog image signals output from the image sensor 101 to the memory section 103.

Further, the camera controller 102 transmits signals to and from a focus adjustment section 205 and a diaphragm driving section 204, referred to hereinafter, of the lens device 200, via a lens mount section 220 and a lens controller 206, referred to hereinafter, of the lens device 200.

In the present embodiment, the memory section 103 not only includes the above-mentioned ROM and RAM, but also has a function of storing analog image capturing signals output from the image sensor 101.

The photometry section 104 acquires analog image signals output from the image sensor 101 which also plays the role of a photometry sensor, from the memory section 103, as luminance signals corresponding to the brightness of a field, and calculates an object luminance by performing amplification, logarithmic compression, analog-to-digital conversion, and so forth, on the luminance signals.

The AF detection section 105 acquires signal voltages of analog image signals from the memory section 103, which have been output from a plurality of detection elements (a plurality of pixels) used for phase difference detection, which are included in the pixels forming the image sensor 101, and performs analog-to-digital conversion thereof to thereby generate image signals. Further, the camera controller 102 acquires the generated image signals from the AF detection section 105 and calculates a distance to each focusing point of an object. This is a technique (known art) referred to as the imaging surface phase difference AF.

The image processor 107 performs a variety of image processing operations on image data stored in the RAM provided in the memory section 103. Specifically, there are performed a variety of image processing operations for developing, displaying, and recording digital image data, including processing for correcting defects of pixels caused by the optical system of the lens device 200 or the image sensor 101, demosaicing, white balance correction processing, color interpolation, and gamma processing.

The signal input section 106 refers to a release button, to which are connected a switch SW1 (not shown) which outputs an on-signal when a first stoke depression (half depression) is performed, and a switch SW2 (not shown) which outputs an on-signal when a second stoke depression (full depression) is performed. The on-signals output from the switches SW1 and SW2 are input to the camera controller 102. When the on-signal from the switch SW1 is output, the camera controller 102 starts photometry and ranging of the image capturing apparatus 100, and when the on-signal from the switch SW2 is output, the camera controller 102 starts a photographing operation.

The recording/outputting section 108 performs recording of data including image data in a recording medium, such as a removable memory card, outputting of the data to an external apparatus via an external interface, and the like.

The LED 109 is built into the image capturing apparatus 100, and performs lighting as an AF assist light, or performs flickering as a self-timer lamp for notifying a user of a photographing timing when self-timer photographing is performed.

The camera-side ACC connection section 140 is connected to a strobe-side ACC connection section 340, referred to hereinafter, of the light emitting device 300 to transmit an instruction signal from the camera controller 102 to a strobe controller 311. With this, the strobe controller 311 having received the instruction signal controls flashlight emission of a flashlight emitting tube 321, referred to hereinafter, and light emission of an LED 322, described hereinafter.

The lens device 200 includes an optical system comprised of a zoom lens 201, a focus lens 202, and a diaphragm 203, in addition to the diaphragm driving section 204, the focus adjustment section 205, the lens controller 206, and the lens mount section 220.

The optical system of the lens device 200, when in a state attached to the image capturing apparatus 100, guides a light flux from an object to the image sensor 101 to form an object image on the imaging surface of the image sensor 101.

The lens controller 206 receives instruction signals for the diaphragm driving section 204 and the focus adjustment section 205 from the camera controller 102 via a mount contact portion, not shown, provided across the camera mount section 120 and the lens mount section 220, and the diaphragm driving section 204 and the focus adjustment section 205 are drive-controlled according to instructions from the lens controller 206.

Next, the light emitting device 300 will be described.

The light emitting device 300 is broadly divided into three sections: a strobe body section 310, a strobe head section 320, and a bounce mechanism section 330.

The strobe body section 310 accommodates the strobe controller 311 that controls the overall operation of the light emitting device 300, a strobe operation section 312 including a power switch, a display section 313, a power supply 314, the strobe-side ACC connection section 340, and so forth, which are mounted on a main substrate, not shown.

The strobe controller 311 receives an instruction from the camera controller 102 or an instruction from the strobe operation section 312 and controls light emission of the flashlight emitting tube 321 and the LED 322 included in the strobe head section 320, as will be described hereinafter. This light emission control is performed based on temperature information acquired by a temperature sensor 323 provided in the strobe head section 320, as will be described hereinafter. Note that in the present embodiment, the light emission mode of the LED 322 has a first light emission mode in which the LED 322 is used as a modeling lamp and a second light emission mode in which the LED 322 is used as the AF assist light. For the sake of LED light emission control in these modes, a temperature threshold value of each light emission mode is set by the strobe controller 311 (first setting unit). Specifically, as the temperature threshold value for the first light emission mode, there are set a first modeling lamp temperature threshold value Tlim_mod1 and a second modeling lamp temperature threshold value Tlim_mod2 lower than the first modeling lamp temperature threshold value Tlim_mod1. Further, as the threshold value for the second light emission mode, there are set a first AF assist light temperature threshold value Tlim_AF1 (first temperature threshold value) and a second AF assist light temperature threshold value Tlim_AF2 (second temperature threshold value) lower than the first AF assist light temperature threshold value Tlim_AF1. Details of these temperature threshold values will be described hereinafter.

The bounce mechanism section 330 accommodates an irradiation direction-changing mechanism, not shown, as a known system in an external strobe, such as the light emitting device 300, a bounce mechanism, not shown, and so forth.

The irradiation direction-changing mechanism holds the strobe head section 320 in a state rotatable in a horizontal direction and a vertical direction with respect to the strobe body section 310. This makes it possible to perform bounce photographing by changing the irradiation direction of light emitted from the flashlight emitting tube 321.

A main capacitor 331 boosts the voltage of the power supply 314 to several hundred volts (V) using a boost circuit, not shown, to charge (accumulate) electrical energy in the main capacitor 331. A resistor (voltage detection unit), not shown, for detecting a voltage of the main capacitor 331, is integrated as a component in the boost circuit.

The strobe head section 320 accommodates the flashlight emitting tube 321, the LED 322, the temperature sensor 323, and so forth, necessary for strobe light emission.

The flashlight emitting tube 321 (flashlight emission unit) is a xenon tube or a quartz tube, and emits flashlight by converting electrical energy charged in the main capacitor 331 to light energy according to a light emission signal received from the strobe controller 311. Around the flashlight emitting tube 321, there are arranged a reflection umbrella and a Fresnel lens, neither of which is shown, to adjust light distribution.

The LED 322 (light emission unit) is lit as the modeling lamp or the AF assist light, for the purpose of assisting photographing of the image capturing apparatus 100, according to a light emission signal received from the strobe controller 311. A lens, not shown, is disposed in front of the LED 322 so as to adjust light distribution of the LED 322. As the color temperature of the LED 322 in the present embodiment, one of color temperatures within a range of 3000 to 6500 K is used. The amount of light emitted from the LED 322 is controlled by PWM control. A table of the light emission amount and the duty ratio in the PWM control is recorded in a nonvolatile memory, not shown, such as an EEPROM, disposed within the strobe controller 311.

The temperature sensor 323 (temperature detection unit) is disposed in the vicinity of the LED 322 on a substrate, not shown, on which the LED 322 is mounted, and detects a temperature in the vicinity of the LED 322 so as to estimate the internal temperature of the LED 322. The temperature sensor 323 outputs a measurement result to the strobe controller 311 as temperature information. The strobe controller 311 performs heat limitation based on the temperature information acquired from the temperature sensor 323 to prevent the temperature of the LED 322 from exceeding a rated temperature and the LED 322 from being overheated and broken. Details of this control will be described hereinafter.

Although in the present embodiment, the LED 322 is mounted in the strobe head section 320, the location where the LED 322 is mounted is not limited to this insofar as the light emission direction of the LED 322 is within the light emitting device 300 and is substantially the same as the light emission direction of the flashlight emitting tube 321. For example, the LED 322 may be mounted in a central portion of the strobe body section 310. In this case, the use of the LED 322 is changed from the modeling lamp to a video light. Note that in this case, the LED 322 can also be used as the AF assist light.

This concludes the description of the basic configuration of the camera system 1 including the image capturing apparatus 100, the lens device 200, and the light emitting device 300.

Next, the operation of the present embodiment will be described below with reference to FIGS. 2, 3, 4, and 5.

Figure 2:
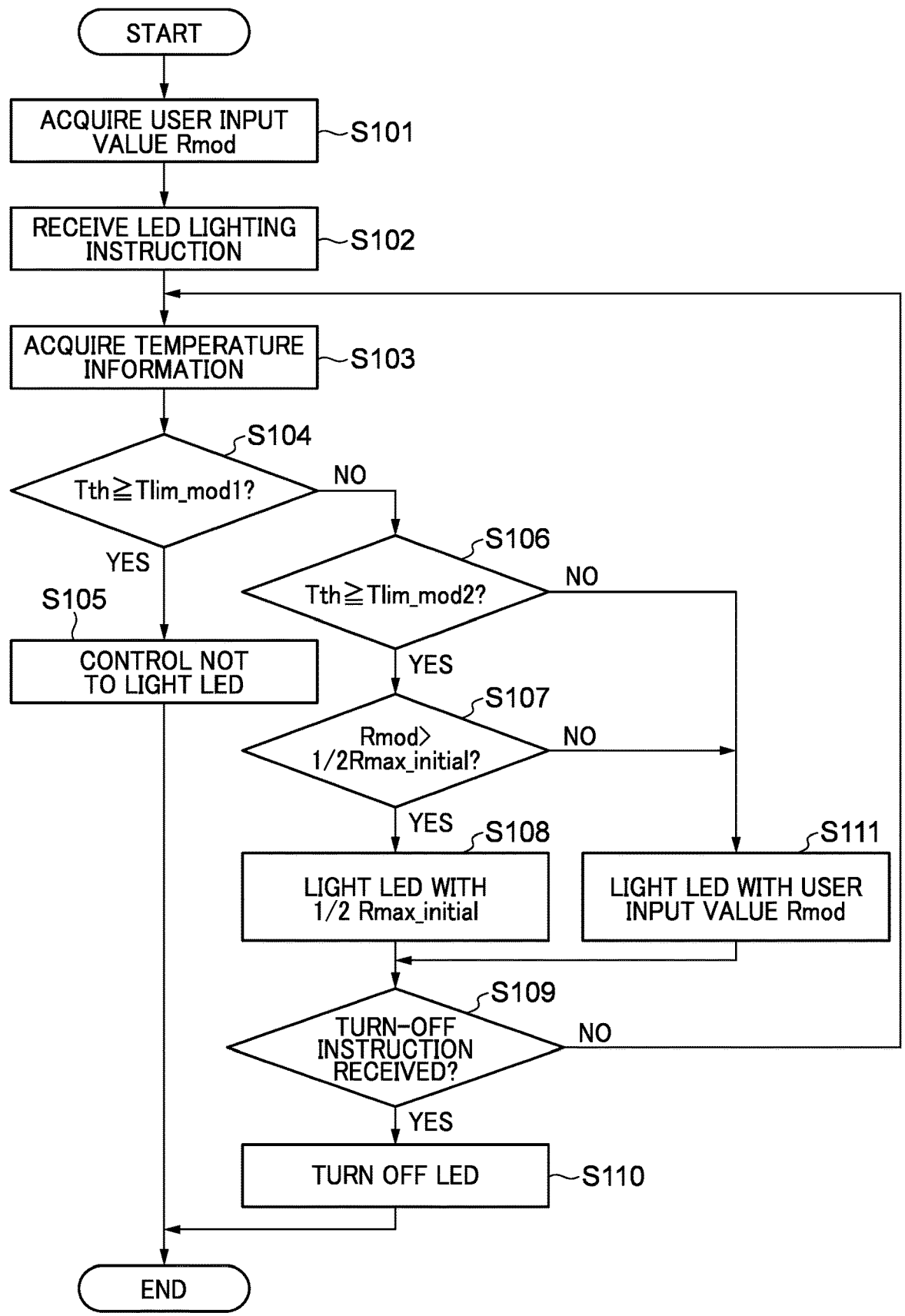
FIG. 2 is a flowchart of a modeling lamp-lighting process performed by a strobe controller appearing in FIG. 1.

FIG. 2 is a flowchart of a modeling lamp-lighting process.

The present process is executed by the strobe controller 311 that loads a program stored in a ROM, not shown, of the strobe body section 310 into a RAM, not shown, of the same.

First, in a step S101, when a user selects the first light emission mode by operating the strobe operation section 312 and inputs a light emission amount Rmod of the LED 322 in the first light emission mode, the strobe controller 311 acquires the light emission amount Rmod input by the user and proceeds to a step S102.

In the step S102, an LED lighting instruction is received by the user performing an operation for turning on a modeling lamp ON/OFF button of the strobe operation section 312, the process proceeds to a step S103.

In the step S103, the strobe controller 311 acquires temperature information Tth from the temperature sensor 323 disposed in the vicinity of the LED 322.

In a step S104, the strobe controller 311 determines whether or not the temperature information Tth acquired in the step S103 is equal to or higher than the first modeling lamp temperature threshold value Tlim_mod1. If the acquired temperature information Tth is equal to or higher than the first modeling lamp temperature threshold value Tlim_mod1 (YES to the step S104), the process proceeds to a step S105, wherein the LED 322 is controlled not to be lit, followed by terminating the present process. On the other hand, if the acquired temperature information Tth is lower than the first modeling lamp temperature threshold value Tlim_mod1 (NO to the step S104), the process proceeds to a step S106.

In the step S106, the strobe controller 311 determines whether or not the acquired temperature information Tth is equal to or higher than the second modeling lamp temperature threshold value Tlim_mod2. If the acquired temperature information Tth is equal to or higher than the second modeling lamp temperature threshold value Tlim_mod2 (YES to the step S106), the process proceeds to a step S107. On the other hand, if the acquired temperature information Tth is lower than the second modeling lamp temperature threshold value Tlim_mod2 (NO to the step S106), the process proceeds to a step S111.

In the step S107, the strobe controller 311 determines whether or not the light emission amount Rmod specified by the user in the step S101 is larger than ½ of a maximum light emission amount Rmax_initial of the LED 322. If Rmod>½ Rmax_initial holds (YES to the step S107), the process proceeds to a step S108, whereas if Rmod≤½ Rmax_initial holds (NO to the step S107), the process proceeds to the step S111.

In the step S108, since the acquired temperature information Tth is equal to or higher than the second modeling lamp temperature threshold value Tlim_mod2, it is necessary to protect the LED 322 from heat. For this reason, the LED 322 is lit with ½ Rmax_initial which is the light emission amount of half of the maximum light emission amount Rmax_initial. Then, the process proceeds to a step S109.

On the other hand, in the step S111, since the acquired temperature information Tth is lower than the second modeling lamp temperature threshold value Tlim_mod2, the LED 322 is lit by the user input value Rmod acquired in the step S101. Then, the process proceeds to the step S109.

In the step S109, the strobe controller 311 confirms whether or not an instruction for turning off the LED 322 has been received from the user. There are two methods of the user instructing turning off of the LED 322: As the first method, the user presses the modeling lamp ON/OFF button (not shown) of the strobe operation section 312 to turn off this button. As the second method, the user provides performs the second stroke depression (full depression) of the signal input section 106 of the image capturing apparatus 100. In this case, when an on-signal is output from the switch SW2 to the strobe controller 311 via the camera controller 102 and the ACC connection section, the strobe controller 311 confirms that the instruction for turning off the LED 322 has been received from the user. If the instruction for turning off the LED 322 has been received from the user (YES to the step S109), the process proceeds to a step S110, wherein the LED 322 is turned off, followed by terminating the present process. On the other hand, if the instruction for turning off the LED 322 has not been received from the user (NO to the step S109), the process returns to the step S103 in a state in which the LED 322 continues to be lit.

Thus, according to the present process, the temperature information Tth is repeatedly acquired to monitor the temperature of the LED 322 until the LED 322 is controlled not to be lit (step S105) or turned off according to the turning off instruction from the user (step S110). With this, even in a case where light emission from the LED 322 continues for a long time, it is possible to prevent a situation where the temperature within the LED 322 largely increases and exceeds the rated temperature of the LED 322.

Next, an AF control process will be described with reference to FIG. 3. In this process, the lighting timing of the AF assist light of the image capturing apparatus 100 is set.

Figure 3:
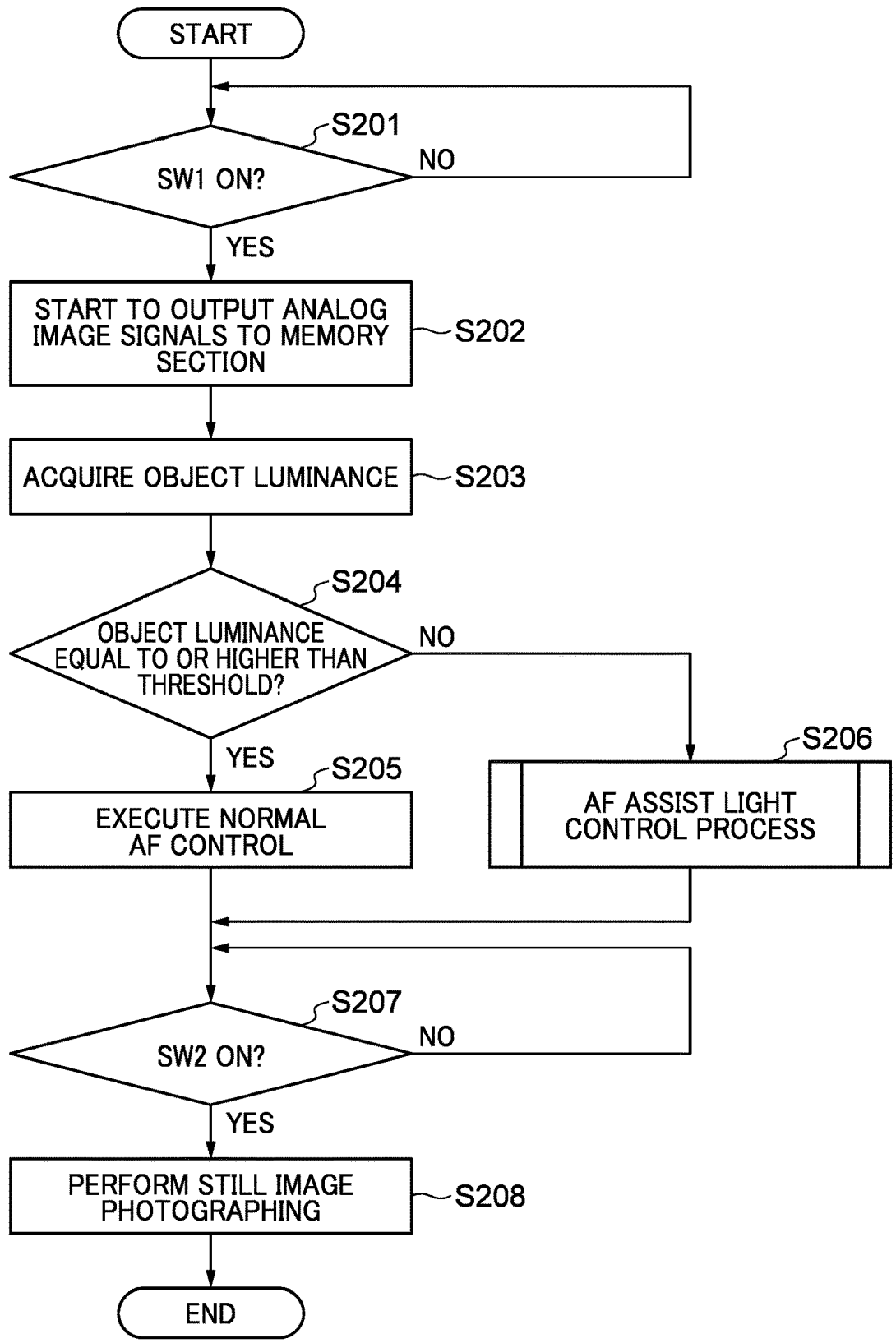
FIG. 3 is a flowchart of an AF control process performed by a camera controller appearing in FIG. 1.

FIG. 3 is a flowchart of the AF control process.

The present process is executed by the camera controller 102 that loads an associated control program stored in the ROM of the memory section 103 into the RAM of the memory section 103.

First, in a step S201, when the user performs the first stroke depression (half depression) of the signal input section 106 of the image capturing apparatus 100, whereby an on-signal is output from the switch SW1 to the camera controller 102, the process proceeds to a step S202 to start the AF control operation. On the other hand, in a case where the on-signal is not output from the switch SW1, the camera controller 102 waits to receive the on-signal in the step S201.

In the step S202, the camera controller 102 starts to output analog image signals from the image sensor 101 to the memory section 103.

In a step S203, the camera controller 102 acquires an object luminance calculated based on the analog image signals stored in the memory section 103, from the photometry section 104.

In a step S204, the camera controller 102 determines whether or not the object luminance acquired in the step S202 is equal to or higher than a threshold value. If it is determined that the object luminance is equal to or higher than the threshold value (YES to the step S204), the process proceeds to a step S205, whereas if it is determined that the object luminance is lower than the threshold value (NO to the step S204), the process proceeds to a step S206.

In the step S205, the camera controller 102 executes normal AF control. When execution of the normal AF control is completed, the process proceeds to a step S207. Note that the normal AF control is the AF control of the conventional technique in which the LED 322 is not used for the assist light, and hence detailed description of the control is omitted.

In the step S206, the camera controller 102 performs an AF assist light control process for performing AF control by lighting the LED 322 for the assist light. Note that although details will be described hereinafter, actually, the AF assist light control process is executed by not only the camera controller 102, but also the strobe controller 311, in cooperation. When the AF assist light control process is completed, the process proceeds to the step S207.

In the step S207, when the user performs the second stroke depression (full depression) of the signal input section 106 of the image capturing apparatus 100, whereby an on-signal is output from the switch SW2 to the camera controller 102, the process proceeds to a step S208. On the other hand, in a case where the on-signal is not output from the switch SW2, the camera controller 102 waits to receive the on-signal in the step S207.

In the step S208, the camera controller 102 executes still image photographing, followed by terminating the present process.

FIGS. 4A to 4D are flowcharts of details of the AF assist light control process in the step S206 in FIG. 3.

Figure 4A:
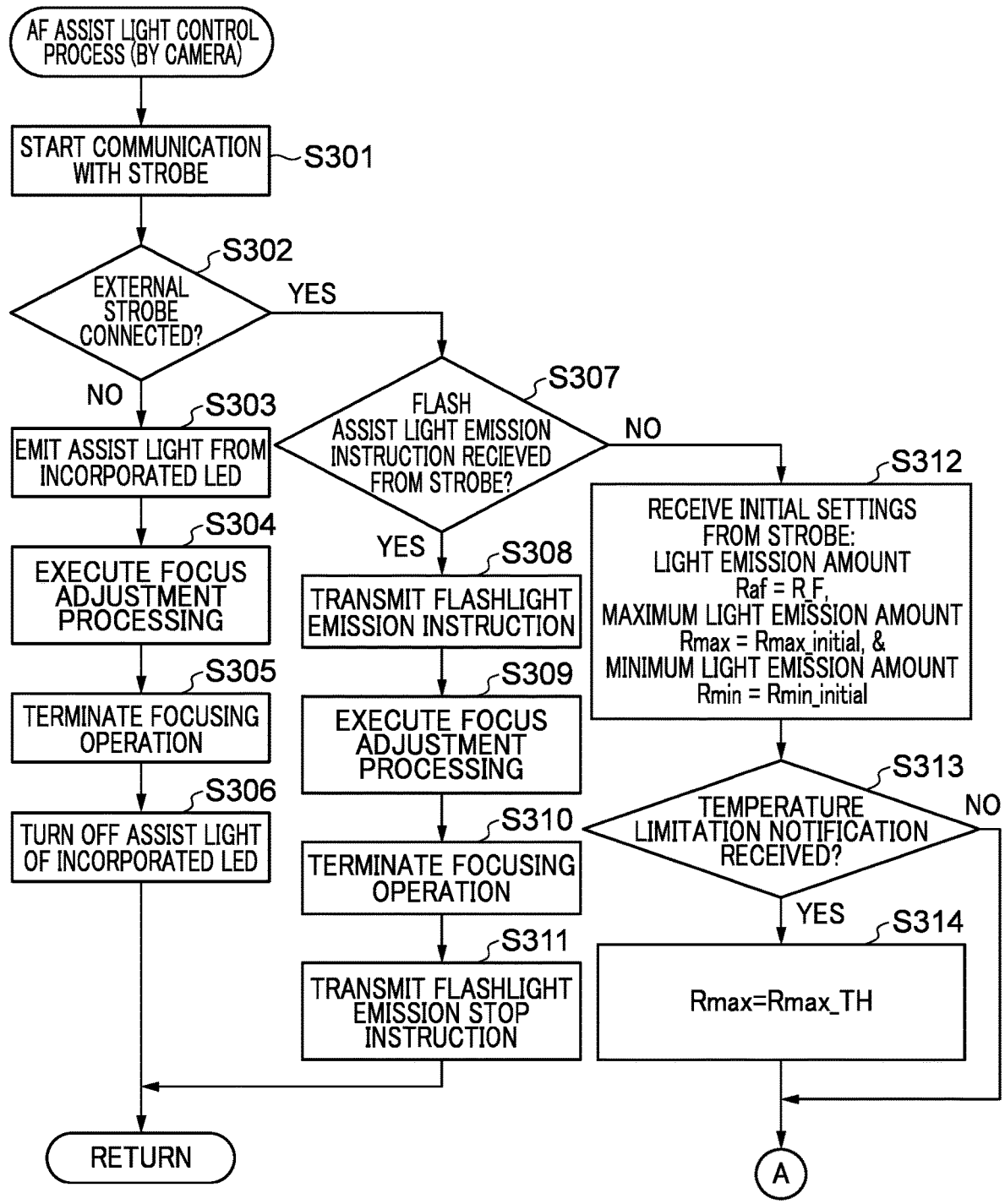
FIG. 4A is a flowchart of an AF assist light control process performed by an image capturing apparatus in a step in FIG. 3.
Figure 4B:
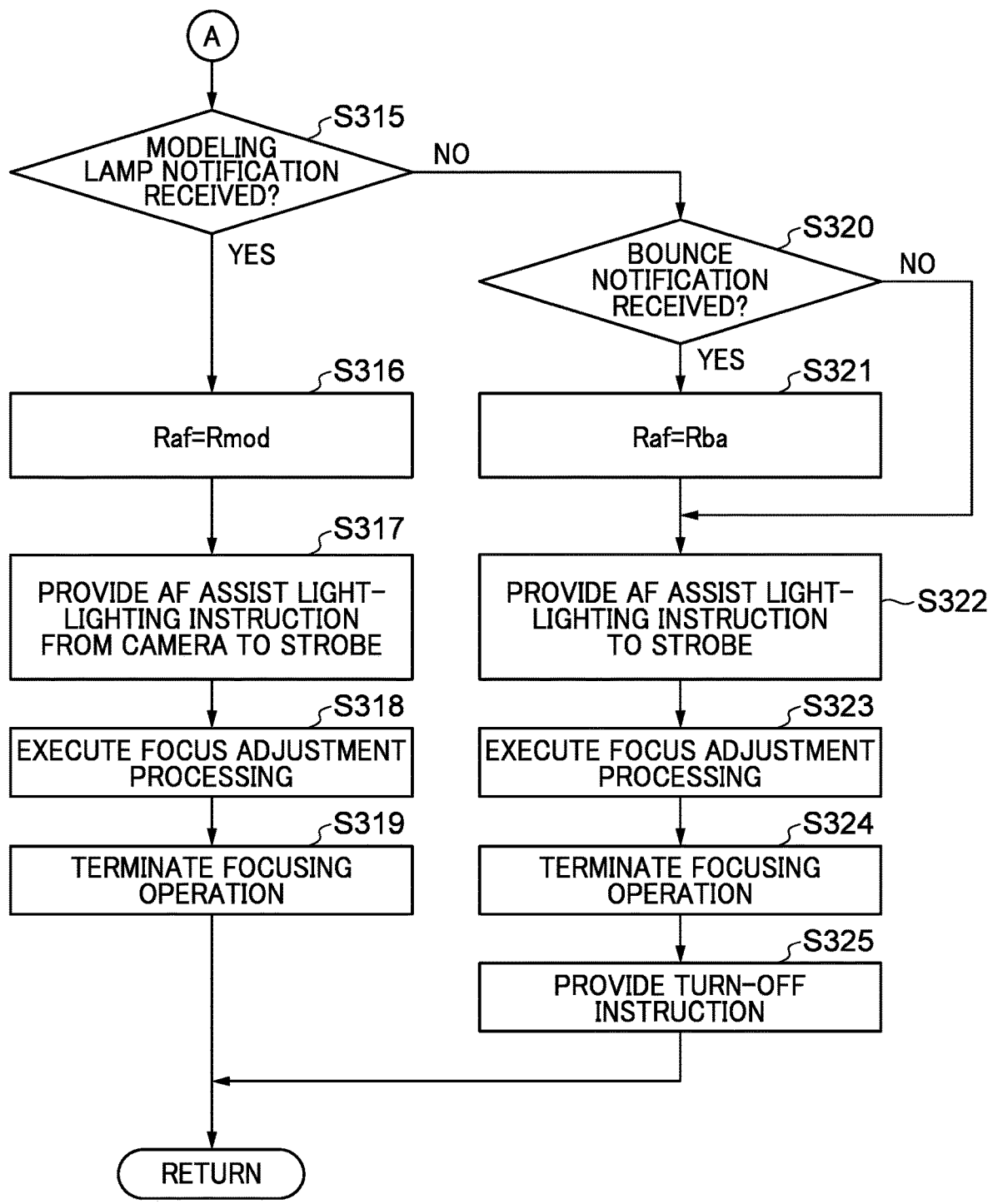
FIG. 4B is a continuation of FIG. 4A.
Figure 4C:
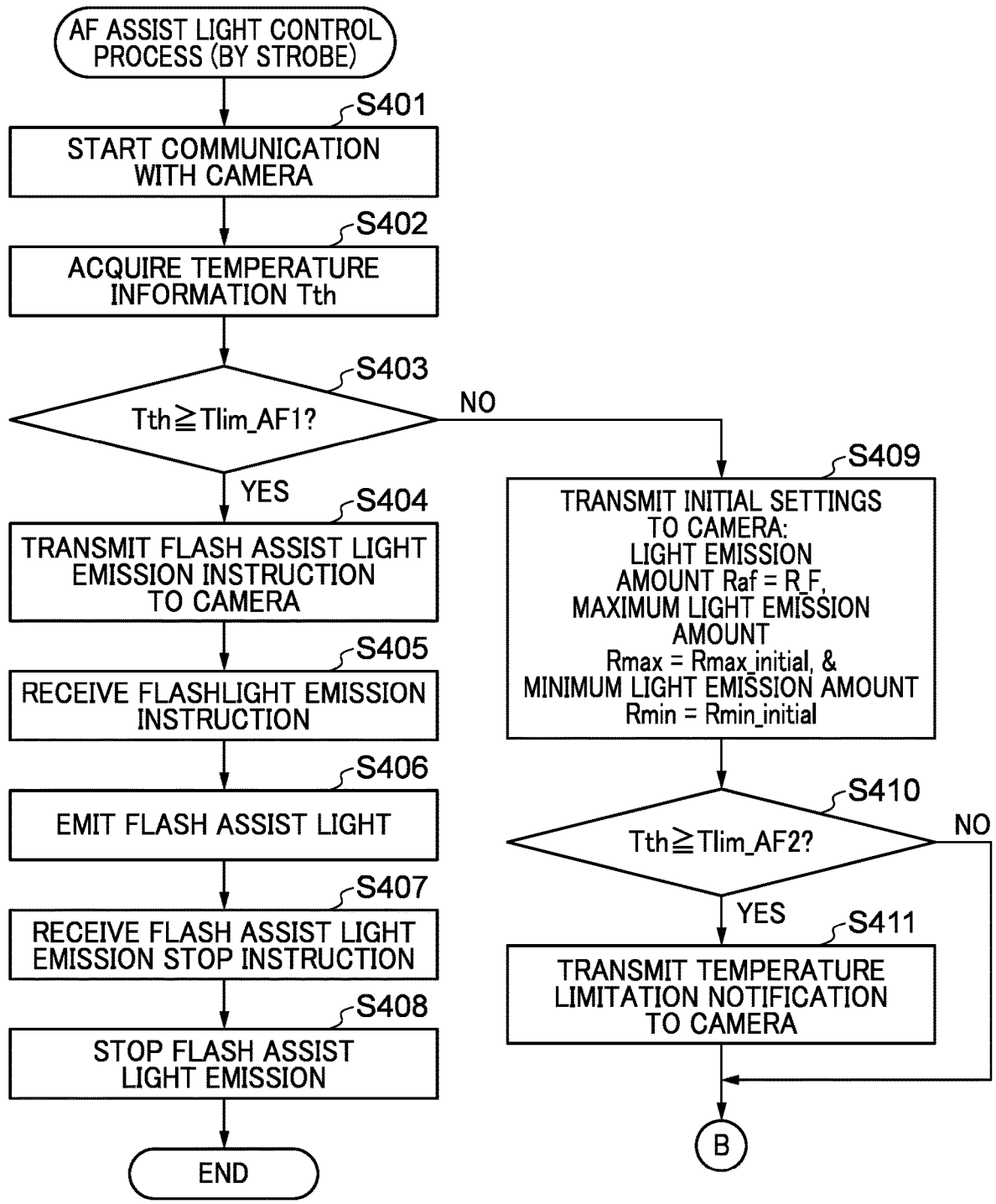
FIG. 4C is a flowchart of an AF assist light control process performed by a light emitting device in a step in FIG. 3.
Figure 4D:
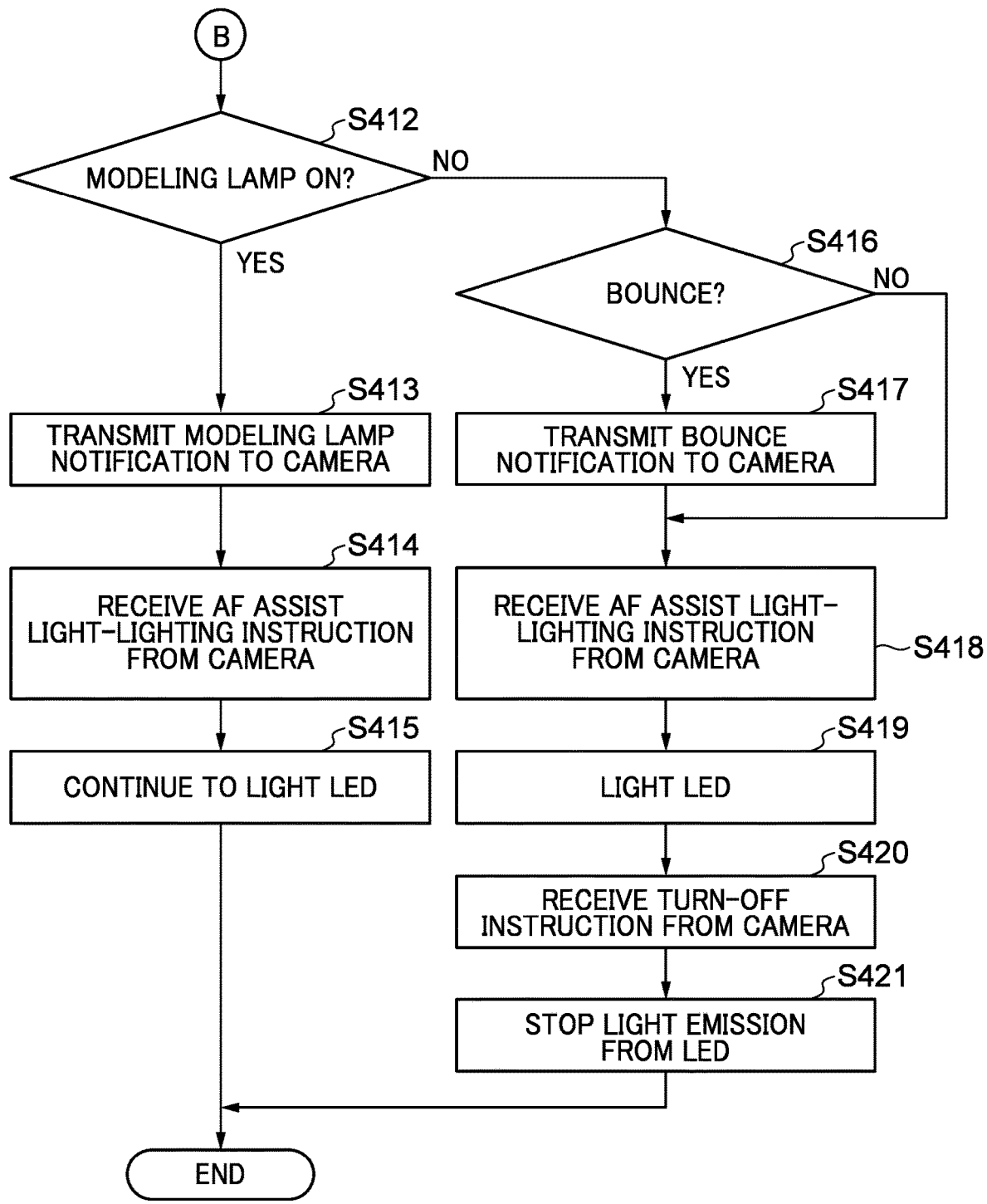
FIG. 4D is a continuation of FIG. 4C.

FIGS. 4A and 4B are a flowchart of the AF assist light control process performed by the image capturing apparatus 100, and FIGS. 4C and 4D are a flowchart of the AF assist light control process performed by the light emitting device 300.

First, the AF assist light control process performed by the image capturing apparatus 100 (the camera controller 102) will be described with reference to FIGS. 4A and 4B.

The present process is executed by the camera controller 102 that loads an associated control program stored in the ROM of the memory section 103 into the RAM of the memory section 103.

First, in a step S301, the camera controller 102 starts camera-strobe communication via the camera-side ACC connection section 140.

In a step S302, the camera controller 102 determines whether or not the light emitting device 300 as an external strobe is connected to the image capturing apparatus 100. If the light emitting device 300 is not connected (NO to the step S302), the process proceeds to a step S303, whereas if the light emitting device 300 is connected (YES to the step S302), the process proceeds to a step S307.

In the step S303, the camera controller 102 turns on the LED 109 of the image capturing apparatus 100 for the AF assist light with a fixed light amount.

In a step S304, the camera controller 102 performs focus adjustment processing while lighting the LED 109 for the AF assist light with the fixed light amount. More specifically, first, the camera controller 102 instructs the AF detection section 105 to acquire analog image signals output from the image sensor 101 after the LED 109 has started to be lit in the step S303, from the memory section 103, and generate image signals to be used for phase difference detection. Next, the camera controller 102 calculates the AF information from the image signals generated by the AF detection section 105. Specifically, the camera controller 102 calculates a defocus distance to the object (defocus amount), the contrast, the reliability, and so forth. After that, the camera controller 102 instructs the lens controller 206 to move the focus lens 202 to an in-focus position by driving the focus adjustment section 205 based on results of these calculations. Note that in a case where the defocus amount cannot be calculated, the focus lens 202 is search-driven, and is driven to a position where the defocus amount can be calculated.

In a step S305, when the focus lens 202 is moved to the in-focus position, the focusing operation is terminated. Note that in a case where the defocus amount cannot be calculated even when the focus lens 202 is moved over the whole focusing region by search driving, it is determined that the focus cannot be obtained, and the focusing operation is terminated.

In a step S306, the LED 109 is turned off, followed by terminating the present process.

In the step S307, the camera controller 102 determines whether or not a flash assist light emission instruction has been received in a step S404, referred to hereinafter. If the flash assist light emission instruction has been received (YES to the step S307), the process proceeds to a step S308, whereas if the flash assist light emission instruction has not been received (NO to the step S307), the process proceeds to a step S312.

In the step S308, the camera controller 102 transmits an instruction (flashlight emission instruction) for causing the flashlight emitting tube 321 to start intermittent light emission for the AF assist light (hereinafter referred to as light emission of the flash AF assist light) to the strobe controller 311. The light emission of the flash AF assist light is a known technique, and hence detailed description thereof is omitted.

In a step S309, the camera controller 102 performs the same focus adjustment processing as in the step S305 while causing the flashlight emitting tube 321 to perform the intermittent light emission for the AF assist light.

In a step S310, the focusing operation is terminated by the same processing as in the step S305.

In a step S311, the camera controller 102 transmits an instruction for stopping light emission of the flash AF assist light (flashlight stop instruction) to the strobe controller 311, followed by terminating the present process.

Next, a description will be given of the step S312 and steps S313 to S319 executed in a case where, in the light emitting device 300, not the flashlight emitting tube 321, but the LED 322 is caused to emit light for the AF assist light.

First, a light emission amount Raf of the AF assist light (AF assist light emission amount Raf) using the LED 322 will be described. The light emission amount Raf is determined according to condensing capability of the lens device 200, i.e. the aperture of the diaphragm 203 at the time of AF processing. The setting of the aperture of the diaphragm 203 at the time of AF processing is set to an open F-number of the lens device 200 differently from the photographing time. This is because it is possible to maintain high AF performance, i.e. the in-focus reaching distance and the response by taking in more amount of light when the AF is performed.

Figure 5:
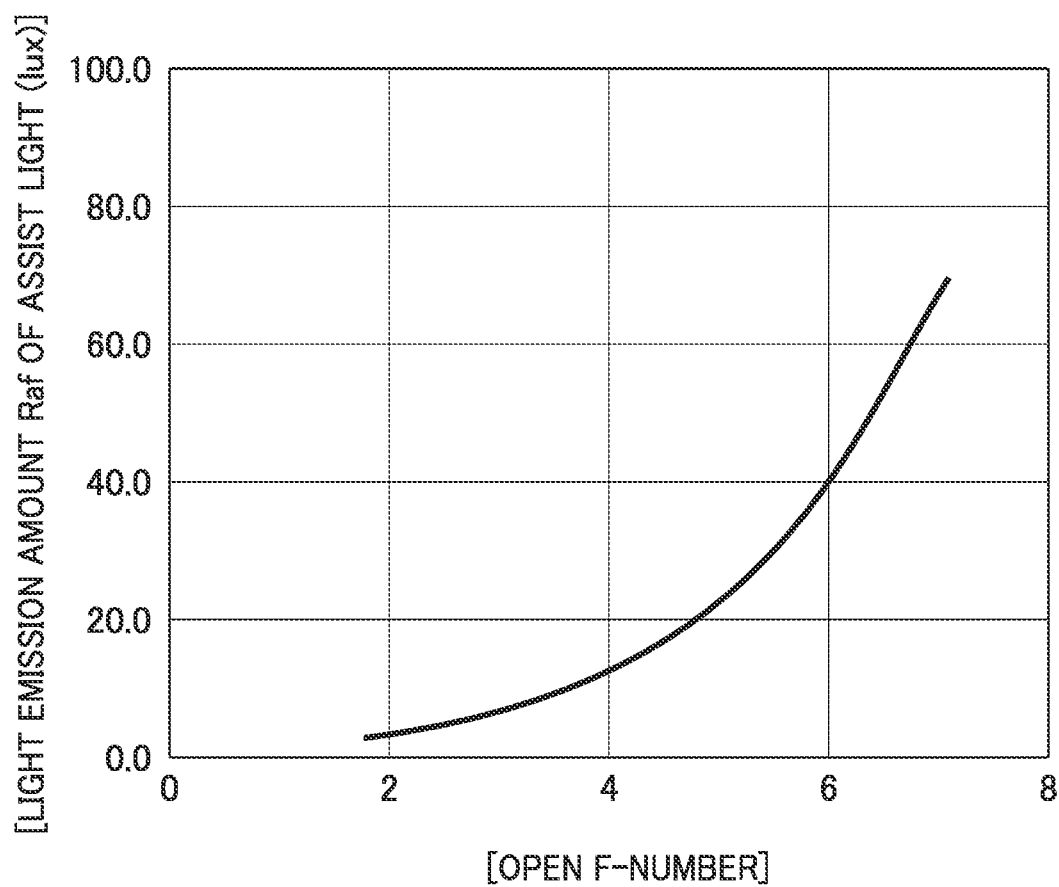
FIG. 5 is a graph showing a relationship between an open F-number (lens aperture value at the time of AF) of a lens device appearing in FIG. 1 and a light emission amount Raf of the AF assist light.

FIG. 5 is a graph showing a relationship between the open F-number (the lens aperture value at the time of AF processing) of the lens device 200 and the light emission amount Raf of the AF assist light.

This graph shows a light emission amount required when focusing on a chart placed at a distance specified by the standard with the fixed exposure (ISO and Tv) of the image capturing apparatus 100 at the time of AF processing. As a value of the aperture of the diaphragm 203 is smaller, the aperture is closer to the open state, and the condensing capability is higher, and hence it is possible to take in an amount of light sufficient to perform AF processing even with a small amount of the assist light, and prevent a person as an object from feeling dazzled. Although the light emission amount is determined according to the value of the diaphragm 203 in the present embodiment, the light emission amount may be determined according to a focal length of the lens device 200. Further, the light emission amount Raf of the AF assist light is basically determined with reference to the open F-number of the lens device 200 indicated in the graph shown in FIG. 5 but is sometimes changed depending on a state of the light emitting device 300. Details of the change will be described in the explanation of the following step S312 et seq.

Referring again to FIG. 4A, in the step S312, the camera controller 102 communicates with the strobe controller 311 of the light emitting device 300 to receive initial settings of the AF assist light emission amount Raf, an upper limit light emission amount Rmax, and a lower limit light emission amount Rmin of the LED 322. Here, the initial setting of the AF assist light emission amount Raf is an AF assist light emission amount Raf_F having the lens aperture value F as a variable, the initial setting of the upper limit light emission amount Rmax is Rmax_initial, and the initial setting of the lower limit light emission amount Rmin is Rmin_initial.

In the step S313, the camera controller 102 determines whether or not a temperature limitation notification has been received from the strobe controller 311 in a step S411, referred to hereinafter. If the temperature limitation notification has been received (YES to the step S313), the process proceeds to the step S314, wherein the camera controller 102 updates the upper limit light emission amount Rmax by overwriting the initial setting Rmax_initial with a light emission amount Rmax_TH included in the temperature limitation notification, and then proceeds to a step S315 in FIG. 4B. The light emission amount Rmax_TH is set to be smaller than the initial setting Rmax_initial, for example, smaller by one stop. If the temperature limitation notification has not been received (NO to the step S313), the process directly proceeds to the step S315 in FIG. 4B without limiting the light emission amount.

In the step S315, the camera controller 102 determines whether or not a notification that the modeling lamp is being lit at present (modeling lamp notification) has been received from the strobe controller 311. If the modeling lamp notification has been received (YES to the step S315), the process proceeds to a step S316, whereas if the modeling lamp notification has not been received (NO to the step S315), the process proceeds to a step S320. The modeling lamp notification includes information on the light emission amount Rmod with which the LED 322 is being lit as the modeling lamp at present, as will be described hereinafter.

In the step S316, the camera controller 102 updates the light emission amount Raf of the AF assist light by overwriting the AF assist light emission amount Raf_f with the light emission amount Rmod which is the current light emission amount of the modeling lamp.

In the step S317, the camera controller 102 notifies the strobe controller 311 of an AF assist light-lighting instruction for setting the light emission amount Raf of the AF assist light to the light emission amount Rmod. That is, this means that light emission from the LED 322 is continued without changing the current light emission amount Rmod.

In the step S318, the camera controller 102 performs the same focus adjustment processing as in the step S305 under an environment in which the LED 322 is being lit with the light emission amount notified in the immediately preceding step (step S317).

In the step S319, when the focusing operation is terminated by the same processing as in the step S305, the camera controller 102 maintains the light emitting state of the LED 322, followed by terminating the present process.

This concludes the process performed by the image capturing apparatus 100 (the camera controller 102) in the case where the AF assist light-lighting instruction is provided when the modeling lamp is being lit.

Next, a description will be given of the step and steps S320 to S325 executed in a case where the AF assist light-lighting instruction is provided when the modeling lamp is not being lit.

In the step S320, the camera controller 102 determines whether or not a notification that the strobe head section 320 is in a bounce state (bounce notification) has been received from the strobe controller 311. If the bounce notification has been received (YES to the step S320), the process proceeds to a step S321, whereas if the bounce notification has not been received (NO to the step S320), the process proceeds to a step S322. The bounce notification includes information on a light emission amount Rba specific to the bounce state, described hereinafter, in the step S321.

In the step S321, the camera controller 102 updates the light emission amount Raf of the AF assist light by overwriting the AF assist light emission amount Raf_f with the light emission amount Rba. In the bounce photographing, light reflected from a wall and/or a ceiling is used, and hence an amount of light not smaller than a predetermined amount is required. Further, on the other hand, assuming that a light emitting surface of the light emitting device 300 faces toward a photographer, consideration needs to be taken, for setting the light emission amount to such a value as will prevent light from dazzling the photographer' eyes even if the light from the LED 322 enters the photographer's eyes from a close distance. Taking these points into consideration under the bounce state, the light emission amount Raf of the AF assist light is set to the light emission amount Rba which is a fixed light emission amount.

In the step S322, the camera controller 102 notifies the strobe controller 311 of an AF assist light-lighting instruction for setting the light emission amount Raf of the AF assist light to the light emission amount Rba.

With this, in a case where the strobe head section 320 is in the bounce state, the light emission amount Raf of the AF assist light is set to the light emission amount Rba specific to the bounce state, which is included in the bounce notification received from the strobe side in the step S321. On the other hand, in a case where the strobe head section 320 is in a non-bounce state, the light emission amount Raf of the AF assist light is set to the light emission amount Raf_F according to the condensing capability of the lens device 200, i.e. the aperture of the diaphragm 203. Further, as for the light emission amount Raf of the AF assist light, in a case where the temperature limitation notification is received in the step S411, referred to hereinafter, the upper limit light emission amount Rmax is set to the light emission amount Rmax_TH.

In the steps S323 and S324, the same processing operations as in the steps S318 and S319 are executed.

In the step S325, the camera controller 102 provides a turn-off instruction to the strobe controller 311, followed by terminating the present process.

Thus, when the AF assist light-lighting process performed by the image capturing apparatus 100 (the camera controller 102) is terminated, the process returns to the step S207 in FIG. 3.

Next, the AF assist light-control process performed by the light emitting device 300 (the strobe controller 311) will be described with reference to FIGS. 4C and 4D.

The present process is executed by the strobe controller 311 that loads an associated program stored in the ROM, not shown, of the strobe body section 310 into the RAM, not shown, of the same.

First, in a step S401, the strobe controller 311 starts camera-strobe communication via the strobe-side ACC connection section 340.

In a step S402, the strobe controller 311 acquires the temperature information Tth from the temperature sensor 323 disposed in the vicinity of the LED 322.

In a step S403, the strobe controller 311 determines whether or not the temperature information Tth acquired by the temperature sensor 323 is equal to or higher than the first AF assist light temperature threshold value Tlim_AF1 (first temperature threshold value). If Tth Tlim_AF1 holds (YES to the step S403), the process proceeds to the step S404, whereas if Tth<Tlim_AF1 holds (NO to the step S403), the process proceeds to a step S409.

The first AF assist light temperature threshold value Tlim_AF1 set to be higher than the first modeling lamp temperature threshold value Tlim_mod1 (i.e. such that Tlim_AF1>Tlim_mod1 holds). The modeling lamp is lit before photographing a still image in order to check in advance how strobe light is irradiated and how a shade appears, and when the modeling lamp is once lit, the modeling lamp continues to be lit for several tens seconds to several minutes (first time period), and hence the temperature rise is large. Compared with this, the light emission time of the AF assist light in one lighting operation is a time period required to search the whole region when the focus lens 202 is search-driven, and hence this light emission time is a short time period of several hundreds msec to several seconds (second time period). Therefore, the temperature rise is smaller than in the case where the LED 322 is used as the modeling lamp, and the temperature is lowered by natural heat dissipation after turning off the LED 322. Further, the temperature sensor 323 disposed in the vicinity of the LED 322 is not configured to directly measure an internal temperature Tled_internal of the LED 322. For this reason, there is a deviation between the actual internal temperature Tled_internal of the LED 322 and the temperature information Tth acquired from the temperature sensor 323, and further, there is a time lag. Taking the above into consideration, the threshold value is set such that Tlim_AF1>Tlim_mod1 holds.

In the step S404, the strobe controller 311 transmits an instruction for lighting not the AF assist light using the LED 322, but the flash AF assist light using the flashlight emitting tube 321 formed e.g. by a xenon tube or a quartz tube (flash assist light emission instruction) to the camera controller 102. This makes it possible to prevent the LED 322 from being broken or deteriorated by heat.

In a step S405, the strobe controller 311 receives an instruction for starting light emission of the flash AF assist light (flashlight emission instruction) from the camera controller 102, and the process proceeds to a step S406.

In the step S406, the flashlight emitting tube 321 starts intermittent light emission as the flash AF assist light. The flash AF assist light is a known technique, and hence detailed description thereof is omitted.

In a step S407, the strobe controller 311 receives an instruction for stopping light emission of the flash AF assist light (flashlight emission stop instruction) from the camera controller 102, and the process proceeds to a step S408.

In the step S408, the flashlight emitting tube 321 stops intermittent light emission as the flash AF assist light, followed by terminating the present process.

Next, a description will be given of the step S409, a step 410, the step S411, and steps S412 to S415 executed in a case where the temperature information Tth acquired by the temperature sensor 323 is lower than the first AF assist light temperature threshold value Tlim_AF1 (lower than the first temperature threshold value). In this case, the control for causing not the flashlight emitting tube 321 but the LED 322 to emit light as the AF assist light is performed.

In the step S409, the strobe controller 311 transmits the initial settings of the AF assist light emission amount Raf, the upper limit light emission amount Rmax, and the lower limit light emission amount Rmin of the LED 322 of the light emitting device 300 to the camera controller 102. The initial settings are as described in the step S312 in FIG. 4A. Specifically, the initial setting of the AF assist light emission amount Raf1 is Raf_F, the initial setting of the upper limit light emission amount Rmax is Rmax_initial, and the initial setting of the lower limit light emission amount Rmin is Rmin_initial.

In the step S410, the strobe controller 311 determines whether or not the temperature information Tth acquired by the temperature sensor 323 is equal to or higher than the second AF assist light temperature threshold value Tlim_AF2. If Tth≥Tlim_AF2 holds (YES to the step S410), the process proceeds to the step S411, whereas if Tth<Tlim_AF2 holds (NO to the step S410), the process skips the step S411 and proceeds to a step S412 in FIG. 4D.

The second AF assist light temperature threshold value Tlim_AF2 is set to be higher than the second modeling lamp temperature threshold value Tlim_mod2 (i.e. such that Tlim_AF2>Tlim_mod2 holds). This is because the temperature rise is smaller when the LED 322 is lit as the AF assist light than when the LED 322 is lit as the modeling lamp. Note that details of this reason have been described above as the reason for setting the first AF assist light temperature threshold value Tlim_AF1 to be higher than the first modeling lamp temperature threshold value Tlim_mod1, and hence description thereof is omitted.

Further, the AF assist light temperature threshold value and the modeling lamp temperature threshold value each have two temperature threshold values as described above. These temperature threshold values are set such that a difference between the first AF assist light temperature threshold value Tlim_AF1 and the second AF assist light temperature threshold value Tlim_AF2 is smaller than a difference between the first modeling lamp temperature threshold value Tlim_mod1 and the second modeling lamp temperature threshold value Tlim_mod2. This is also because the temperature rise is smaller when the LED 322 is lit as the AF assist light than when the LED 322 is lit as the modeling lamp.

That is, in the present embodiment, the following expression holds:

$$Tlim\_AF1 - Tlim\_AF2 < Tlim\_mod1 - Tlim\_mod2$$

In the step S411, the strobe controller 311 of the light emitting device 300 transmits a notification (temperature limitation notification) that the upper limit light emission amount Rmax of the LED 322 is limited (reduced) to the light emission amount Rmax_TH (e.g. Rmax_initial minus one stop) so as to protect the LED 322 from heat. With this, in the image capturing apparatus 100, the upper limit light emission amount Rmax is overwritten with the light emission amount Rmax_TH notified in the step S409 for update.

In the step S412 in FIG. 4D, the strobe controller 311 determines whether or not the modeling lamp is being lit, i.e. the LED 322 is being lit as normal light emission lighting. If the modeling lamp is being lit (YES to the step S412), the process proceeds to the step S413, whereas if the modeling lamp is not being lit (NO to the step S412), the process proceeds to a step S416.

In the step S413, the strobe controller 311 transmits a notification that the modeling lamp is being lit at present (modeling lamp notification) to the camera controller 102. The modeling lamp notification includes a request for setting the light emission amount Raf of the AF assist light to the light emission amount Rmod with which the LED 322 is being lit as the modeling lamp at present.

In the step S414, the strobe controller 311 receives an instruction for lighting the LED 322 by setting the light emission amount Raf of the AF assist light to the light emission amount Rmod (AF assist light-lighting instruction) from the camera controller 102.

In the step S415, the strobe controller 311 continues to light the LED 322 without changing the current light emission amount Rmod according to the AF assist light-lighting instruction received in the step S414, followed by terminating the present process.

This concludes the description of the process performed by the light emitting device 300 (the strobe controller 311) in a case where an AF assist light-lighting instruction is provided when the modeling lamp is being lit.

Next, a description will be given of the step S416 and steps S417 to S421 executed in a case where an AF assist light-lighting instruction is provided when the modeling lamp is not lit.

In the step S416, the strobe controller 311 determines whether or not the strobe head section 320 is in the bounce state, i.e. whether or not the light emission surface of the strobe head prat 320 faces toward the front, based on a detection signal output from a detection switch, not shown. If the strobe head section 320 is in the bounce state (YES to the step S416), the process proceeds to the step S417, whereas if the strobe head section 320 is in the non-bounce state (NO to the step S416), the process skips the step S417 and proceeds to the step S418.

In the step S417, the strobe controller 311 transmits a notification that the strobe head section 320 is in the bounce state (bounce notification) to the camera controller 102. The bounce notification includes a request for setting the light emission amount Raf of the AF assist light to the light emission amount Rba specific to the bounce state. Note that details of the light emission amount Rba have already been described in the step S321.

In the step S418, the strobe controller 311 receives an instruction for setting the light emission amount Raf of the AF assist light to the light emission amount Rba specific to the bounce state, which is the fixed light emission amount, (AF assist light-lighting instruction) from the camera controller 102.

In the step S419, the strobe controller 311 turns on the LED 322 with the light emission amount Rba according to the AF assist light-lighting instruction received in the step S418.

In the step S420, the strobe controller 311 receives a turn-off instruction for stopping lighting of the AF assist light using the LED 322 from the camera controller 102, and the process proceeds to the step S421.

In the step S421, the strobe controller 311 stops light emission from the LED 322 according to the turn-off instruction received in the step S420, followed by terminating the present process.

As described above, in the present embodiment, the different temperature threshold values are provided so as to be set for the respective cases where light emission of the LED 322 is used as the modeling lamp and where light emission of the LED 322 is used as the AF assist light. With this, the strobe controller 311 (control unit) can control light emission of the LED 322 according to a use. For example, if the temperature information Tth acquired by the temperature sensor 323 exceeds the modeling lamp temperature threshold value, the LED 322 used as the modeling lamp is sometimes not lit or is sometimes dimmed. Even in such a case, unless the temperature information Tth reaches the AF assist light temperature threshold value lower than the modeling lamp temperature threshold value, it is determined that the LED 322 can be used up to the maximum light emission amount as the AF assist light, whereby the light emission control is performed. Further, in a case where the temperature information Tth exceeds the first AF assist light temperature threshold value Tlim_AF1, the AF assist light is switched to the flash AF assist light using the flashlight emitting tube 321, whereby the control for achieving the role of the AF assist light is performed. According to the present embodiment, it is possible to cause the LED 322 to exhibit sufficient performance for respective uses of the case where the LED 322 is used as the modeling lamp and the case where the LED 322 is used as the AF assist light, while ensuring the temperature reliability of the LED 322.

Next, a method of calculating the temperature threshold value Tlim set by the strobe controller 311 in advance will be described.

The temperature threshold value Tlim in each light emission mode is determined from the maximum energy total sum EN applied to the LED 322 in each of the above-described first and second light emission modes.

The maximum energy total sum EN is expressed by a product of the number of times of light emission N which is the maximum number in an assumed continuous use time TIME, and the power consumption H and the light emission time LT of the LED 322 in one lighting operation:

$$EN = N \times H \times LT$$

Further, the temperature threshold value Tlim is expressed by the following equation:

$$Tlim = Tj - k \times EN - a$$

In the above equation, Tj represents a junction temperature of the LED 322, k represents a heat loss correction coefficient based on the LED light emission efficiency, and a represents a temperature margin. It is preferable to cause a difference between the internal temperature of the LED 322 and the measured temperature Tth acquired by the temperature sensor 323 to be included in the temperature margin a.

An example of calculation of the temperature threshold value Tlim in a case where the assumed continuous use time TIME is 1800 sec, the junction temperature Tj of the LED 322 is 120° C., and the temperature margin a is 10° C. will be described below.

In the first light emission mode in which the LED 322 is used for the modeling light emission, since the LED 322 can be continuously lit, the number Nmod of times of light emission is 1. Further, the power consumption Hmod and the light emission time LTmod of the LED at the time of the maximum light emission are 0.6 W and 1800 sec, respectively. Further, assuming that the heat loss correction coefficient kl based on the LED light emission efficiency is 0.0185, the maximum energy total sum in the first light emission mode is calculated by the following equation:

$$ENmod = Nmod \times Hmod \times LTmod = 1 \times 0.6 \times 1800 = 1080$$

Therefore, the temperature threshold value of the modeling light emission is calculated by the following equation:

$$Tlim\_mod1 = Tj - k1 \times ENmod - a$$
$$= 120 - 0.0185 \times 1080 - 10 = 90° C.$$

On the other hand, in the second light emission mode in which the LED 322 is used for the AF assist light, the light emission time LTaf, i.e. the search-driving time varies with the lens device 200 and the image capturing apparatus 100 in use. For example, the search-driving time is several hundreds msec in a case where it is short, but in a case where the focus lens 202 is a lens requiring time to move, such as a super-telephotographic lens or a macro lens, the search-driving time becomes several tens msec. The difference in search-driving time is caused by the size of a focusing area, the weight of the focus lens 202, the type of the focus adjustment section 205 (a stepping motor or an ultrasonic motor), and further, the value of current supplied to the focus adjustment section 205 which varies with a place in the camera ranking of the image capturing apparatus 100. Therefore, the temperature threshold value of the AF assist light may be changed according to the lens device 200 and the image capturing apparatus 100 in use.

Assuming that the light emission time (=search-driving time) LTaf is 5 sec, and a time period LTaf_pause to elapse after the AF assist light is turned off until it is turned on again is 3 sec, the number Naf of times of light emission of the AF assist light is calculated by the following equation:

$$Naf = 1800/(5+3) = 225 \text{ (times)}$$

Further, assuming that the LED power consumption Haf of the AF assist light is 0.6 W, and the heat loss correction coefficient kl based on the LED light emission efficiency is 0.0185, the maximum energy total sum of the AF assist light emission is calculated by the following equation:

$$ENaf = Naf \times Haf \times LTaf = 225 \times 0.6 \times 5 = 675$$

Therefore, the temperature threshold value of the AF assist light is calculated by the following equation:

$$Tlim\_AF1 = Tj - k1 \times ENaf - a$$
$$= 120 - 0.0185 \times 675 - 10 = 97.5(° C.)$$

As indicated by the above calculation example, in the present embodiment, the different temperature threshold values are set according to respective uses, for example, such that the first modeling lamp temperature threshold value Tlim_mod1 is set to 90° C., and the first AF assist light temperature threshold value Tlim_AF1 is set to 97.5° C. This is because, as mentioned above, the temperature threshold value is set based on the maximum energy total sum which is calculated from how the light emission is performed according to each use. Although in the above description, an influence of heat dissipation is omitted to simplify the explanation, it is possible to calculate a temperature threshold value with higher accuracy by performing calculation with a heat dissipation element included therein.

Next, a description will be given of a second embodiment of the present invention. In the first embodiment, the strobe head section 320 has the LED 322 and the temperature sensor 323 mounted therein. On the other hand, in the present embodiment, the LED 322 and the temperature sensor 323 are mounted in the central portion of the strobe body section 310. Further, although in the first embodiment, the light emitting device 300 is attached to the image capturing apparatus 100, in the present embodiment, the light emitting device 300 and the image capturing apparatus 100 are separately arranged at respective locations, and the light emitting device 300 is used as a slave strobe for wireless strobe photographing. The present embodiment has the same configuration as the first embodiment except these points, and hence the same components in the present embodiment as those in the first embodiment are denoted by the same reference numerals and redundant descriptions thereof are omitted.

Figure 6:
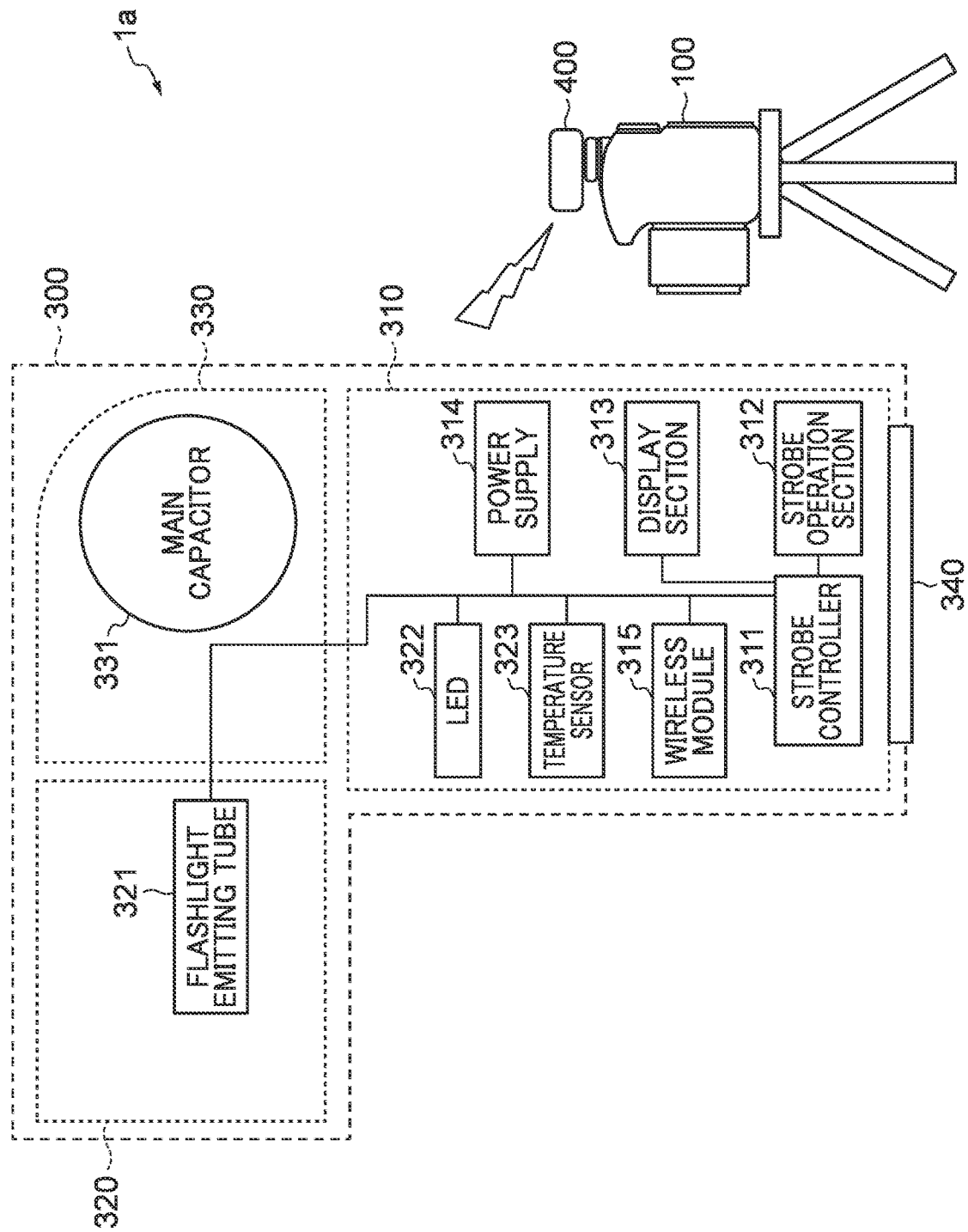
FIG. 6 is a block diagram showing a hardware configuration of a camera system including a light emitting device according to a second embodiment.

FIG. 6 is a block diagram showing a hardware configuration of a camera system 1a including the light emitting device 300 according to the present embodiment.

A wireless module 315 is further disposed in the strobe body section 310, and further, a transmitter 400 is connected to the camera-side ACC connection section 140 of the image capturing apparatus 100. Note that a wireless communication device connected to the image capturing apparatus 100 is not limited to the transmitter 400 insofar as it is the master device of the light emitting device 300 and is communicably connected to the image capturing apparatus 100, and for example, a master device strobe having a wireless module mounted therein may be employed.

The wireless module 315 includes a strobe antenna and performs wireless communication with the transmitter 400 via the strobe antenna.

The strobe controller 311 receives information (instruction) for controlling the light emission timing and the light emission amount from the transmitter 400 via the wireless module 315.

Thus, in the present embodiment, the LED 322 is moved to the central portion of the strobe body section 310, and its use is not the modeling lamp, but the video light. Here, a process for lighting the video light, which is started when the user operates the strobe, is the same as the process described with reference to FIG. 2, and hence the description thereof is omitted. Further, also in the present embodiment, the LED 322 and the light emitting tube 321 can continue to be used as the AF assist light as well, and the AF assist light control process in the step S206 in FIG. 3, described with reference to FIGS. 4A to 4D, can be used by omitting the steps associated with the bounce. Therefore, the description of this process is also omitted.

In the present embodiment, the light emission mode of the LED 322 has a third light emission mode in which light emission is used as a signal indicating charge completion of the main capacitor 331 of the light emitting device 300 which is used as a slave device, in strobe wireless photographing. The following description will be given of a charge completion process for controlling lighting of the LED 322 in the third light emission mode.

Figure 7:
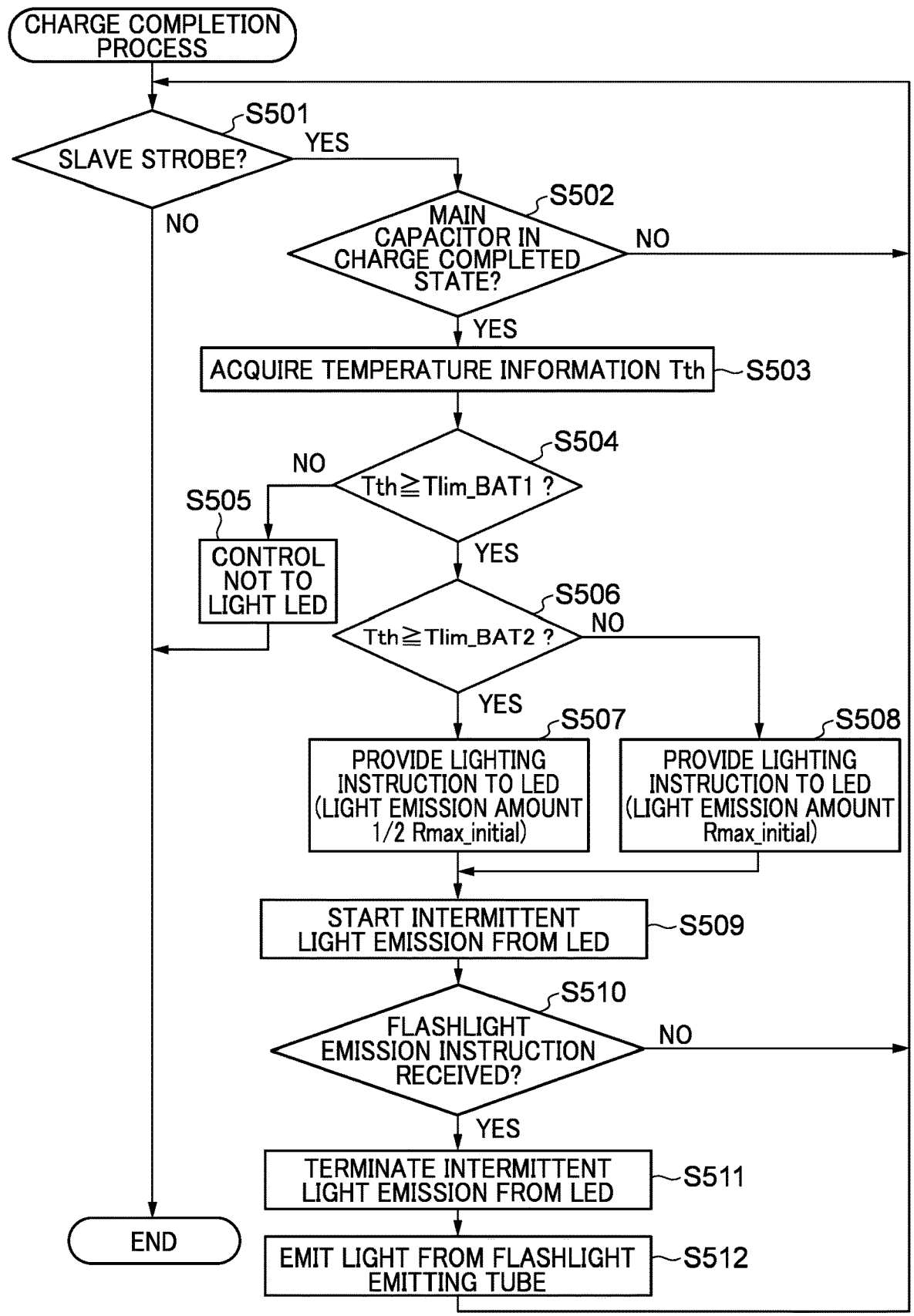
FIG. 7 is a flowchart of a charge completion process performed by a strobe controller appearing in FIG. 6.

FIG. 7 is a flowchart of the charge completion process.

The present process is executed by the strobe controller 311 that loads an associated program stored in the ROM, not shown, disposed in the strobe body section 310 into the RAM, not shown, also disposed in the strobe body section 310.

First, wireless multi-light photographing will be briefly described. The wireless multi-light photographing refers to strobe photographing in which a wireless communication device as a master device is connected to the image capturing apparatus 100, and instructs the light emission amount and the light emission timing to one or more slave strobes placed at locations remote from the wireless communication device, using radio wave communication or optical communication.

In a step S501, the strobe controller 311 confirms settings of wireless photographing of the light emitting device 300, and determines whether or not the light emitting device 300 is a slave strobe (slave to the transmitter 400 as the master device). If the light emitting device 300 is not a slave strobe (NO to the step S501), the present process is immediately terminated. On the other hand, if the light emitting device 300 is a slave strobe (YES to the step S501), the process proceeds to a step S502.

In the step S502, the strobe controller 311 determines whether or not the main capacitor 331 is in a charge completed state. Here, the charge completed state refers to a state in which electric power sufficient for full light emission has been charged in the main capacitor 331. Note that in the present embodiment, the above-mentioned resistor, not shown, for detecting a voltage of the main capacitor 331 is integrated as a component of the boost circuit, not shown, and it is possible to determine whether or not the main capacitor 331 is in the charge completed state, using this resistor. If the main capacitor 331 is not in the charge completed state (NO to the step S502), the process returns to the step S501, and this determination is repeated until it is determined that the main capacitor 331 is in the charge completed state. If the main capacitor 331 is in the charge completed state (YES to the step S502), the process proceeds to a step S503.

In the step S503, the strobe controller 311 acquires the temperature information Tth from the temperature sensor 323 disposed in the vicinity of the LED 322.

In a step S504, the strobe controller 311 determines whether or not the temperature information Tth acquired in the step S503 is equal to or higher than a first charge completion signal temperature threshold value Tlim_BAT1. If the acquired temperature information Tth is equal to or higher than the first charge completion signal temperature threshold value Tlim_BAT1 (YES to the step S504), the process proceeds to a step S505, wherein the LED 322 is controlled not to be lit, followed by terminating the present process. On the other hand, if the temperature information Tth is lower than the first charge completion signal temperature threshold value Tlim_BAT1 (NO to the step S504), the process proceeds to a step S506.

In the step S506, the strobe controller 311 determines whether or not the acquired temperature information Tth is equal to or higher than a second charge completion signal temperature threshold value Tlim_BAT2 lower than the first charge completion signal temperature threshold value Tlim_BAT1. If the acquired temperature information Tth is equal to or higher than the second charge completion signal temperature threshold value Tlim_BAT2 (YES to the step S506), the process proceeds to a step S507. On the other hand, if the temperature information Tth is lower than the second charge completion signal temperature threshold value Tlim_BAT2 (NO to the step S506), the process proceeds to a step S508.

In the step S507, since the acquired temperature information Tth is equal to or higher than the second charge completion signal temperature threshold value Tlim_BAT2, it is necessary to protect the LED 322 from heat. For this reason, the strobe controller 311 provides a lighting instruction to the LED 322 for emitting light with a light amount ½ Rmax_initial which is half of the maximum light emission amount Rmax_initial. Then, the process proceeds to a step S509.

On the other hand, in the step S508, since the acquired temperature information Tth is lower than the second charge completion signal temperature threshold value Tlim_BAT2, the strobe controller 311 provides a lighting instruction to the LED 322 for emitting light with the maximum light emission amount Rmax_initial. Then, the process proceeds to the step S509.

In the step S509, the strobe controller 311 causes the LED 322 to start intermittent light emission at intervals of approximately one second according to the lighting instruction provided in the immediately preceding step (i.e. the step S507 or S508), and then proceeds to a step S510.

In the step S510, the strobe controller 311 determines whether or not an instruction for starting flashlight emission from the flashlight emitting tube 321 (flashlight emission start instruction) has been received from the transmitter 400. If the flashlight emission start instruction has been received (YES to the step S510), the process proceeds to a step S511, whereas if the flashlight emission start instruction has not been received (NO to the step S510), the process returns to the step S501 and continues to wait to receive the flashlight emission start instruction.

In the step S511, the strobe controller 311 terminates intermittent light emission of the LED 322 and proceeds to a step S512.

In the step S512, the strobe controller 311 causes the flashlight emitting tube 321 to emit flashlight according to the flashlight emission start instruction received from the transmitter 400 in the step S510. After the flashlight emission, the process returns to the step S501.

Lighting of the LED 322 as the charge completion signal in a case where the main capacitor 331 has been shifted to the charge completed state is intermittent lighting at intervals of one second, and hence the temperature rise is gentle, compared with the case where the LED 322 is continuously lit as the video light. For this reason, the first charge completion signal temperature threshold value Tlim_BAT1 for determining the availability of the LED 322 for the charge completion signal is set to be higher than the temperature threshold value for determining the availability of the LED 322 as the video light (the same value as the first modeling lamp temperature threshold value Tlim_mod1). Similarly, the second charge completion signal temperature threshold value Tlim_BAT2 for determining the light emission amount of the LED 322 for the charge completion signal is set to be higher than the temperature threshold value for determining the light emission amount of the LED 322 as the video light (the same value as the second modeling lamp temperature threshold value Tlim_mod2).

As described above, in the present embodiment, when the light emitting device 300 is a strobe slave device, and the main capacitor 331 has been shifted to the charge completed state, the LED 322 disposed in the strobe body section 310 is caused to intermittently emit light for indicating charge completion. This makes it possible to notify a user that the light emitting device 300 as the strobe slave device can be used as a video light and the flashlight emitting tube 321 can be used. Further, similar to the first embodiment, also in the present embodiment, it is possible to perform proper light emission control of the LED 322 for each use by setting the different temperature threshold values according to the uses. According to the present invention, it is possible to cause the LED 322 to exhibit sufficient performance for the respective uses of the case where the LED 322 is used as the video light and the case where the LED 322 is used as a flickering light for indicating charge completion, while ensuring the temperature reliability of the LED 322.

Note that although in the present embodiment, the description is given of the case where the light emitting device 300 is a strobe slave device, this is not limitative. That is, the third light emission mode may be a mode in which the LED 322 disposed in the strobe body section 310 is caused to perform intermittent light emission to notify a user of charge completion when the main capacitor 331 has been shifted to the charge completed state.

Next, a description will be given of a third embodiment of the present invention. In the first and second embodiments, the flashlight emitting tube 321 which is formed by a xenon tube or a quartz tube and emits flashlight is mounted in the strobe head section 320. On the other hand, in the third embodiment, a case where the light emission mode of the LED 322 has a fourth mode in which the LED 322 emits flashlight. That is, the present embodiment has the same configuration as the first embodiment except that the flashlight emitting tube 321 and the main capacitor 331 are not mounted in the light emitting device 300 but an LED flashlight dedicated circuit is mounted instead so as to cause the LED 322 to emit flashlight. Therefore, the same components of the present embodiment as those of the first embodiment are denoted by the same reference numerals, and redundant description thereof is omitted.

Figure 8:
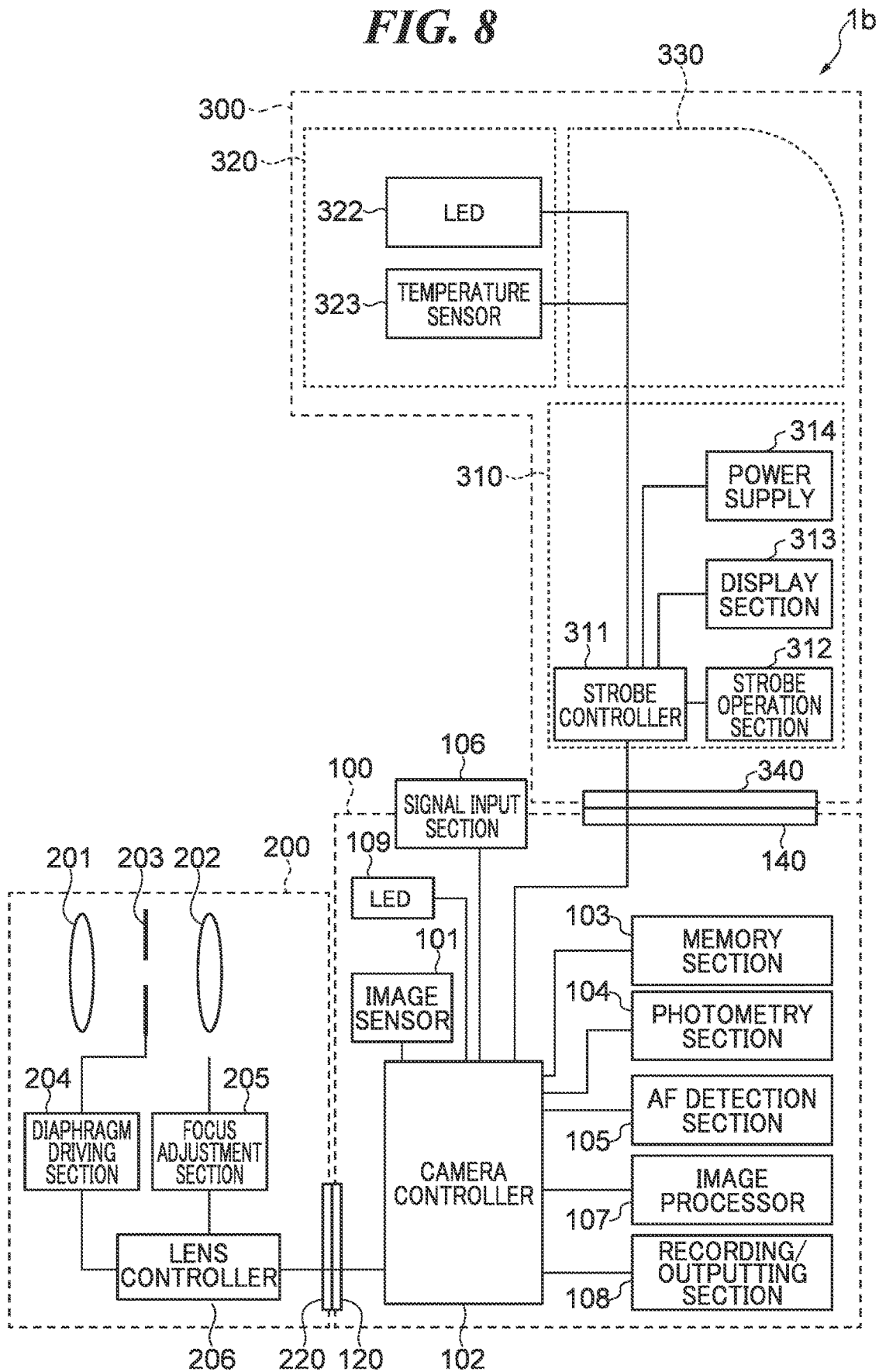
FIG. 8 is a block diagram showing a hardware configuration of a camera system including a light emitting device according to a third embodiment.

FIG. 8 is a block diagram showing a hardware configuration of a camera system 1b according to the present embodiment.

As shown in FIG. 8, in the present embodiment, the flashlight emitting tube 321 and the main capacitor 331 are omitted from the configuration of the first embodiment, and the LED flashlight dedicated circuit, not shown, is added so as to cause the LED 322 to emit flashlight. This is because the current value to be applied to the LED 322 is different between the normal light emission, such as the modeling light emission and the AF assist light, and the flashlight emission, and hence another circuit is required to be provided for flashlight emission.

Further, to perform the following LED flashlight emission process, a temperature threshold value (a first LED flashlight temperature threshold value Tlim_flash1 and a second LED flashlight temperature threshold value Tlim_flash2 lower than the first LED flashlight temperature threshold value Tlim_flash1) in the fourth light emission mode are set by the strobe controller 311 (second setting unit).

FIG. 9 is a flowchart of the LED flashlight emission process.

The present process is executed by the strobe controller 311 that loads an associated program stored in the ROM, not shown, disposed in the strobe body section 310 into the RAM, not shown, also disposed in the strobe body section 310.

In a step S601, the strobe controller 311 receives an LED flashlight emission instruction for causing the LED 322 to emit flashlight from the image capturing apparatus 100.

In a step S602, the strobe controller 311 reads out an elapsed time Interval. Here, the elapsed time Interval is an elapsed time after the last LED flashlight emission, which is counted by the strobe controller 311. However, in a case where the LED flashlight emission has never been performed, the value of the elapsed time Interval is set to 0 sec.

In a step S603, the strobe controller 311 acquires the temperature information Tth from the temperature sensor 323 disposed in the vicinity of the LED 322.

In a step S604, the strobe controller 311 determines whether or not the temperature information Tth acquired in the step S603 is equal to or higher than the first LED flashlight temperature threshold value Tlim_flash1. If the acquired temperature information Tth is equal to or higher than the first LED flashlight temperature threshold value Tlim_flash1 (YES to the step S604), the process proceeds to a step S605. On the other hand, if the acquired temperature information Tth is lower than the first LED flashlight temperature threshold value Tlim_flash1 (NO to the step S604), the process proceeds to a step S607.

In the step S605, the strobe controller 311 determines whether or not the elapsed time Interval acquired in the step S602 is equal to or shorter than a first light emission interval Interval_1. If the elapsed time Interval is equal to or shorter than the first light emission interval Interval_1 (YES to the step S605), the process proceeds to a step S606, wherein the LED flashlight emission is performed, followed by terminating the present process. Note that this is the time at which the LED flashlight emission is started, the strobe controller 311 starts counting the elapsed time after this LED flashlight emission, as the elapsed time Interval. On the other hand, if the acquired elapsed time Interval is longer than the first light emission interval Interval_1 (NO to the step S605), the present process is immediately terminated without causing the LED 322 to emit light.

In the step S607, the strobe controller 311 determines whether or not the acquired temperature information Tth is equal to or higher than the second LED flashlight temperature threshold value Tlim_flash2. If the acquired temperature information Tth is equal to or higher than the second LED flashlight temperature threshold value Tlim_flash2 (YES to the step S607), the process proceeds to a step S608. On the other hand, if the acquired temperature information Tth is lower than the second LED flashlight temperature threshold value Tlim_flash2 (NO to the step S607), the process proceeds to the S606, wherein the LED flashlight emission is performed, followed by terminating the present process.

In the step S608, the strobe controller 311 determines whether or not the acquired elapsed time Interval is equal to or shorter than a second light emission interval Interval_2 shorter than the first light emission interval Interval_1. If the elapsed time Interval is equal to or shorter than the second light emission interval Interval_2 (YES to the step S608), the process proceeds to the step S606, wherein the LED flashlight emission is performed, followed by terminating the present process. On the other hand, if the acquired elapsed time Interval is longer than the second light emission interval Interval_2 (NO to the step S608), the present process is terminated without causing the LED 322 to emit light.

As described above, in the LED flashlight emission process in the present embodiment, in a case where the acquired temperature information Tth becomes equal to or higher than a temperature threshold value, the number of times of light emission of the LED 322 is limited by performing the LED flashlight emission at a light emission interval determined according to the temperature threshold value. However, this is not limitative insofar as it is possible to suppress temperature rise within the LED 322 in the LED flashlight emission process. For example, in a case where the acquired temperature information Tth becomes equal to or higher than a temperature threshold value, the light emission amount may be set to an amount of LED flashlight emission, which is determined according to the temperature threshold value.

Further, similar to the first embodiment, in the configuration of the present embodiment, it is also possible to use the LED 322 as the modeling light emission and the AF assist light. Further, similar to the second embodiment, in a case where the LED 322 is mounted in the central portion of the strobe body section 310, it is also possible to use the LED 322 as the video light and the flickering light for indicating charge completion.

Further, as for the settings of the temperature threshold value used for the LED flashlight emission process, the temperature threshold value may be calculated from the maximum energy total sum EN applied to the LED light emission, as described in the first embodiment, or may be determined from a material heat-resistant temperature of peripheral components.

According to the present invention, the light emission amount and the light emission interval of the LED 322 are controlled in accordance with each of uses of the LED 322, such as the modelling lamp, the video light, the AF assist light, the flickering light for indicating charge completion, and the LED flashlight. With this, it is possible to suppress temperature rise within the LED 322 and cause the LED 322 to exhibit sufficient performance for each use while ensuring the reliability of the LED 322.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The processor or circuit can include a central processing unit (CPU), a micro processing unit (MPU), a graphics processing unit (GPU), an application specific integrated circuit (ASIC), or a field programmable gate array (FPGA). Further, the processor or circuit can include a digital signal processor (DSP), a digital flow processor (DFP) or a neural processing unit (NPU).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-181023 filed Nov. 5, 2021, which is hereby incorporated by reference herein in its entirety.

What is claimed is:

1. A light emitting device comprising:
   a light emission unit;
   a temperature detection sensor;
   the light emitting device operating at least in one of a first light emission mode in which a light emission time in one lighting operation of the light emission unit is a first time period and a second light emission mode in which the light emission time is a second time period shorter than the first time period,
   at least one processor; and
   a memory coupled to the at least one processor, the memory having instructions that, when executed by the processor, perform the operations as:
   a control unit configured to perform different light emission controls on the light emission unit between the first light emission mode and the second light emission mode, based on temperature information detected by the temperature detection sensor.

2. The light emitting device according to claim 1, wherein the light emission unit is an LED.

3. The light emitting device according to claim 1, wherein the memory having instructions that, when executed by the processor, further perform the operations as:
   a first setting unit configured to set respective temperature threshold values for the first light emission mode and the second light emission mode, and
   wherein the temperature threshold value for the first light emission mode is lower than the temperature threshold value for the second light emission mode.

4. The light emitting device according to claim 3, wherein the first setting unit sets two temperature threshold values for each of the first light emission mode and the second light emission mode, and
   wherein a difference between the two temperature threshold values for the first light emission mode is larger than a difference between the two temperature threshold values for the second light emission mode.

5. The light emitting device according to claim 3, wherein the first setting unit determines the respective temperature threshold values for the first light emission mode and the second light emission mode based on a maximum energy total sum in each light emission mode, and
wherein the maximum energy total sum in each light emission mode is a product of the light emission time, the maximum number of times of light emission in an assumed continuous use time of the light emission unit, and power consumption of the light emission unit in one lighting operation in each light emission mode.

6. The light emitting device according to claim 5, wherein the light emission unit assists photographing of an image capturing apparatus and has a focus adjustment section, and
wherein the temperature threshold value for the second light emission mode changes according to a time period required to perform focus adjustment processing by the focus adjustment section.

7. The light emitting device according to claim 3, further comprising:
a capacitor that accumulates electrical energy, and
a flashlight emission unit configured to convert electrical energy accumulated in the capacitor to light energy, and
a voltage detection unit configured to detect a voltage of the capacitor, and
wherein the first setting unit sets a first temperature threshold value and a second temperature threshold value lower than the first temperature threshold value for the second light emission mode,
causes the flashlight emission unit to emit light in the second light emission mode in a case where the temperature information detected by the temperature detection sensor is equal to or higher than the first temperature threshold value, and
reduces the maximum light emission amount in the second light emission mode in a case where the temperature information detected by the temperature detection sensor is equal to or higher than the second temperature threshold value and lower than the first temperature threshold value.

8. The light emitting device according to claim 7, wherein the flashlight emission unit is a xenon tube or a quartz tube.

9. The light emitting device according to claim 7, wherein the light emitting device further operates, in a case where it is detected by the voltage detection unit that the voltage of the capacitor has reached a voltage sufficient to cause the flashlight emission unit to perform full light emission, in a third light emission mode in which the light emission unit is intermittently lit as a signal indicating charge completion.

10. The light emitting device according to claim 1, wherein the first light emission mode is a mode in which the light emission unit is used as a modeling lamp.

11. The light emitting device according to claim 1, wherein the second light emission mode is a mode in which the light emission unit is used as an AF assist light of an image capturing apparatus.

12. The light emitting device according to claim 1, wherein the first light emission mode is a mode in which the light emission unit is used as a video light of an image capturing apparatus.

13. The light emitting device according to claim 1, wherein the light emitting device further operates in a fourth light emission mode in which the light emission unit is caused to emit flashlight, and
wherein the control unit performs a light emission control on the light emission unit in the fourth light emission mode based on the temperature information detected by the temperature detection sensor.

14. The light emitting device according to claim 1, wherein the memory having instructions that, when executed by the processor, further perform the operations as:
a second setting unit configured to set a temperature threshold value for the fourth light emission mode, and
wherein in the fourth light emission mode, the control unit performs a light emission control on the light emission unit based on the temperature information detected by the temperature detection sensor, based on a light emission interval of the light emission unit and the temperature threshold value for the fourth light emission mode.

15. The light emitting device according to claim 1, wherein the temperature detection sensor is disposed in the vicinity of the light emission unit.

16. The light emitting device according to claim 1, wherein the temperature detection sensor is disposed on a substrate on which the light emission unit is mounted.

17. A method of controlling a light emitting device including a light emission unit and a temperature detection sensor, comprising:
operating the light emitting device at least in one of a first light emission mode in which a light emission time in one lighting operation of the light emission unit is a first time period and a second light emission mode in which the light emission time is a second time period shorter than the first time period; and
performing different light emission controls on the light emission unit between the first light emission mode and the second light emission mode based on temperature information detected by the temperature detection sensor.

18. A non-transitory computer-readable storage medium storing a program for causing a computer to execute a method of controlling a light emitting device including a light emission unit and a temperature detection sensor,
wherein the method comprises:
operating the light emitting device at least in one of a first light emission mode in which a light emission time in one lighting operation of the light emission unit is a first time period and a second light emission mode in which the light emission time is a second time period shorter than the first time period; and
performing different light emission controls on the light emission unit between the first light emission mode and the second light emission mode based on temperature information detected by the temperature detection sensor.

* * * * *